(12) United States Patent
Hadwen et al.

(10) Patent No.: US 8,138,463 B2
(45) Date of Patent: Mar. 20, 2012

(54) PHOTOSENSOR AND AMBIENT LIGHT SENSOR WITH CONSTANT BIAS VOLTAGE

(75) Inventors: Benjamin James Hadwen, Oxford (GB); Christopher James Brown, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 468 days.

(21) Appl. No.: 12/444,032

(22) PCT Filed: Oct. 4, 2007

(86) PCT No.: PCT/JP2007/069900
§ 371 (c)(1),
(2), (4) Date: Apr. 2, 2009

(87) PCT Pub. No.: WO2008/044749
PCT Pub. Date: Apr. 17, 2008

(65) Prior Publication Data
US 2010/0026192 A1   Feb. 4, 2010

(30) Foreign Application Priority Data
Oct. 4, 2006   (GB) .................................. 0619581.2

(51) Int. Cl.
*G01J 1/42* (2006.01)
*H03B 37/02* (2006.01)
*G01J 1/44* (2006.01)
(52) U.S. Cl. ........... 250/208.2; 250/214 R; 250/214 AL; 250/214 B
(58) Field of Classification Search .................. 250/205, 250/208.2, 214 B, 214 C, 214 R, 214 AL
See application file for complete search history.

(56) References Cited

U.S. PATENT DOCUMENTS 4,264,161 A * 4/1981 Hosoe et al. .................. 396/153
(Continued)

FOREIGN PATENT DOCUMENTS

EP   1128170   8/2001
(Continued)

OTHER PUBLICATIONS

S.V. Karnik et al., "Novel multiple lateral Polysilicon . . . " SPIE Flat Panel Display Technology and Display Metrology II, 2001, vol. 4295, pp. 120-124.

(Continued)

*Primary Examiner* — Georgia Y Epps
*Assistant Examiner* — Renee Naphas
(74) *Attorney, Agent, or Firm* — Renner, Otto, Boisselle & Sklar, LLP

(57) ABSTRACT

A method of operating a photosensor comprising: applying a bias voltage to a photosensor (12) comprising n (n>1) photosensitive elements (8) connected in series, and determining the photocurrent in the photosensor (12) at a time when the applied bias voltage across the photosensor maintains the photosensor at or close to the point at which it has the greatest signal-to-noise ratio. This may conveniently be done by determining the current in the photosensor at a time when the applied bias voltage across the photosensor is equal or approximately equal to n×Vbi, where Vbi is the bias voltage about which the current in a single one of the photo-sensitive elements (8), in the dark, changes sign. In an embodiment in which the photo-sensitive elements (8) are photodiodes, the bias voltage Vbi is the "built-in" voltage of the photodiodes. The photocurrent generated when n series-connected photodiodes are illuminated is approximately equal to the photocurrent generated when one photodiode is illuminated. However, the leakage current (i.e., the dark current) for the n series-connected photodiodes is significantly lower than the leakage current for one photodiode. The signal-to-noise-ratio is therefore significantly increased.

39 Claims, 18 Drawing Sheets

U.S. PATENT DOCUMENTS

| | | | |
|---|---|---|---|
| 5,117,099 A | 5/1992 | Schmidt | |
| 5,160,837 A * | 11/1992 | Hirane et al. | 250/208.2 |
| 5,210,613 A * | 5/1993 | Lee | 348/315 |
| 5,343,034 A | 8/1994 | Sato | |
| 6,483,099 B1 | 11/2002 | Yu et al. | |
| 2003/0122533 A1 | 7/2003 | Prescott | |
| 2005/0134715 A1 | 6/2005 | Fowler et al. | |
| 2005/0205759 A1 | 9/2005 | Wang | |
| 2006/0027834 A1 | 2/2006 | Forrest et al. | |
| 2007/0256339 A1* | 11/2007 | Fryer et al. | 40/442 |
| 2008/0099068 A1 | 5/2008 | Forrest et al. | |
| 2008/0179503 A1 | 7/2008 | Camargo et al. | |

FOREIGN PATENT DOCUMENTS

| | | |
|---|---|---|
| EP | 1394859 | 3/2004 |
| GB | 1175517 | 12/1969 |
| JP | 63-255975 | 10/1988 |
| JP | 01-151273 | 6/1989 |
| JP | 05-288605 | 11/1993 |
| JP | 2001-159563 | 6/2001 |
| JP | 2001-516150 | 9/2001 |
| JP | 2003-060223 | 2/2003 |
| JP | 2006-118965 | 5/2006 |
| WO | 2005/076253 | 8/2005 |
| WO | 2006/017530 | 2/2006 |
| WO | 2006/095834 | 9/2006 |

OTHER PUBLICATIONS

K. Maeda et al., "The System LCD with Monolithic Ambient-Light Sensor System", SID 2005, vol. XXXVI, Book 1 p. 356.

International Search Report for corresponding application No. PCT/JP2007/069900 completed Dec. 27, 2007.

Search Report for corresponding application No. GB 0619581.2 performed Jan. 23, 2007.

* cited by examiner

PHOTOSENSOR AND AMBIENT LIGHT SENSOR WITH CONSTANT BIAS VOLTAGE

TECHNICAL FIELD

The present invention relates to a photosensor, for example for use as an ambient light sensor. Such sensors are used, for example, with an Active Matrix Liquid Crystal Display (AM-LCD).

BACKGROUND ART

An AMLCD may, for example, be a transmissive display that is illuminated by a backlight placed on the opposite side of the display to an observer. An AMLCD may alternatively be a transflective display which may be illuminated by a backlight in low ambient lighting conditions or by reflected ambient light in bright ambient lighting conditions. It is desirable to control the intensity of the backlight in dependence on the ambient lighting conditions, so that an image displayed on the AMLCD is always clearly visible to an observer but is not uncomfortably bright. A further consideration is that, particularly in the case of an AMLCD incorporated in a mobile device, such as a mobile telephone, it is highly desirable to reduce the power consumption of the backlight so as to maximise battery life. Accordingly, in the case of a transflective display, the backlight is preferably operated at a low intensity in very low ambient lighting conditions, operated at a higher intensity in medium ambient lighting conditions to ensure that an image remained visible to an observer, and switched off in ambient lighting conditions that are bright enough to provide a displayed image using only reflected ambient light.

It is therefore known to provide a mobile AMLCD device with an Ambient Light Sensor (ALS) system, and to control the power level of the backlight in dependence on the output of the ALS system. In order to be able to detect the full range of ambient lighting conditions from bright sunlight to near darkness, such an ALS system requires a high dynamic range and this necessitate detection of low light levels across a wide operating temperature range. Typically, an ALS system is required to be sensitive over a wide range of incident light levels and the typical operating temperature range of a mobile LCD device.

It would be advantageous from both cost and mechanical points-of-view to monolithically integrate all components of an ALS system, including the photo-detection element itself, onto the TFT (thin film transistor) substrate of the display. However, is difficult to achieve the required sensitivity for an ALS system, particularly at low light levels, with an ALS system that is monolithically integrated onto a display substrate. This is due to the relatively poor performance of photodetection elements fabricated in polysilicon processes, such as that used in the fabrication of a typical display TFT substrate.

Conventional ambient light sensor systems may employ discrete photodetection elements or they may employ photodetection elements integrated onto a display substrate. In the case of discrete photodetection elements, the process technology for manufacturing the element is optimised for maximising the sensitivity of the device. In the case of integrated photodetection elements, such as a photodetection element integrated on a CMOS Integrated Circuit (IC), the processing technology is however a compromise between maximising the sensitivity of the photodetection element and maximising the performance of the peripheral circuitry.

In the case of an AMLCD with a monolithically integrated ambient light sensor, the basic photodetection device used must be compatible with the fabrication processes used in the manufacture of the display TFT substrate. A well-known photodetection device compatible with the standard TFT process is the lateral, thin-film, polysilicon p-i-n diode, the structure of which is shown in cross-section in FIG. 1.

In the thin-film p-i-n diode of FIG. 1, a layer 3 of silicon is deposited over a substrate 1; there may be one or more intermediate layers between the layer of silicon and the substrate 1, and one such intermediate layer 2 is shown in FIG. 1. The silicon layer 3 is deposited as an intrinsic (i.e., not intentionally doped) layer, and subsequently one end region 3a of the silicon layer 3 is doped p-type and the other end region 3b of the silicon layer 3 is doped n-type. The remaining part of the silicon layer remains as a region 3c of intrinsic silicon. A gate insulating layer 4 and a dielectric layer 5 are grown over the substrate 1 and the silicon layer 3, and via holes are then formed in the gate insulating layer 4 and dielectric layer 5 so as to expose the p-type and n-type doped regions 3a,3b of the silicon layer. Finally, electrodes 6, 7 are provided so as to contact the p-type and n-type doped regions 3a,3b of the silicon layer respectively.

FIG. 2 is a schematic illustration of the p-i-n diode of FIG. 1 in use. The detailed operation of this device is somewhat complicated but, in brief, when the bias $V_A$ maintained across the electrodes 6,7 is negative as referenced (as shown in FIG. 2 where $V_{anode}$ is a negative voltage applied to the anode and the cathode of the device is grounded), two photosensitive depletion regions A,B are formed, one at the interface between the p-type silicon region 3a and the intrinsic region 3c and the other at the interface between the n-type silicon region 3b and the intrinsic region 3c. When the device is illuminated some of the incident photons are absorbed in the semiconductor material via the photoelectric effect, with each photon that is absorbed creating (at least) one electron-hole pair. Such photo-generated electron-hole pairs, known as carriers, will be created throughout the illuminated volume of the device. In general however it is only those carriers that are created either within a depletion region, or else sufficiently close to a depletion region to be able to diffuse into it, that are able to contribute to the photo-generated current and therefore be detected by the device. In FIG. 2 only the electrons from depletion region A and the holes from depletion region B can contribute to the photocurrent since the carrier lifetime in the undepleted intrinsic region 3c at the centre of the device is short and thus carriers swept under the influence of the depletion region electric field into the undepleted intrinsic region 3c will almost inevitably recombine.

One problem in providing an integrated ALS system is that photodiodes fabricated in a polysilicon TFT process have a much lower sensitivity than photodiodes fabricated in bulk technologies (such as CMOS), for two principal reasons:

Firstly the volume of semiconductor material that is photosensitive (the device's depletion region) is generally quite small. In particular the depth of the thin film layer of material is typically designed to be only a few tens of manometers, and as a result a large fraction of the illuminating radiation passes straight through the device unabsorbed and therefore undetected.

Secondly the dark current generated by thin film devices tends to be higher than in bulk devices. The dark current, defined as the diode leakage current under the condition of no illumination, is highly dependent both on temperature and the electric field across the device. It is therefore also extremely sensitive to the potential difference applied to the photodiode anode and cathode terminals.

Accordingly, an ambient light sensor comprising a thin-film polysilicon photodiode is likely to exhibit poor sensitivity and low dynamic range.

EP 1 394 859 describes lateral photodiode fabrication in a p-Si TFT process, with a novel processing technique used to suppress the leakage current. The implementation of this device in a circuit arrangement will still however operate the lateral photodiode in a mode where the lateral electric field is quite high. The leakage current will therefore still be relatively high. Therefore, whilst the processing technique described may be effective in reducing the leakage current, the implementation described is unlikely to increase the sensitivity of the photodiode sufficiently for use in a high dynamic range ALS system.

S. V. Karnik at al. describe, in "Novel multiple lateral Polysilicon $p^+$-n-$n^+$ and $p^+$-p-$n^+$ Diodes", Proceedings of SPIE Vol. 4295 (p. 120-124, Flat Panel Display Technology and Display Metrology II), 2001, the use of poly-silicon thin film diodes connected in series as electrical circuit elements in forward and reverse biased modes of operation. The principal advantage of such an arrangement is that the leakage current in reverse biased mode of the series connected arrangement is reduced. No mention is made however of the use of these structures as photodiodes As well as the photodetection element described above, a practical ambient light sensor system in an AMLCD will also contain:

(a) bias circuitry to control the photodetection element and sense the photo-generated charge; and (b) output circuitry to supply an output signal (analogue or digital) representing the measured ambient light level.

The display will further contain (c) a means of adjusting the display operation based on the measured ambient light level, for example by controlling the backlight intensity.

Many suitable types of output circuitry (i.e. amplifiers or analogue-to-digital converters for analogue or digital output respectively) are well-known. Similarly, the concept of dynamically adjusting a backlight intensity based on the measured ambient light level is known as disclosed, for example, in WO2005076253A1 or by K. Maeda et al. in "The System LCD with Monolithic Ambient-Light Sensor System", Proceeding of SID 2005, Vol. XXXVI, Book 1, p 356.

Limitations of current ALS systems, particularly monolithically integrated systems, may lie not only with the photodetection device (as described above) but also with the level of performance of the bias circuitry used to control their operation. The bias circuitry should be arranged to robustly control the operation of the photodetection device such that, ideally, it maximises the sensitivity of the photodetection device and allows a consistent photodetection device current to be measured free from the effects of process variations in manufacture of components of the photodetection device and/or bias circuitry, electronic interference and temperature effects.

US 2005/134715 describes an active pixel sensor comprising of a photodiode plus integrator circuit whereby feedback is used to optimally bias the photodiode so as to maximise the sensitivity of the photodiode. A disadvantage of this method is the requirement to interrupt the illumination supply to the photodiode in order for the feedback mechanism to adjust the operating bias across the photodiode. Additionally the circuit embodiments described would be difficult to replicate in polysilicon to the required degree of precision.

Maeda et al. (above) describe an LCD that incorporates an ambient light sensor comprising a lateral p-i-n photodiode and analogue processing circuits that are integrated directly onto the display substrate. The bias circuit disclosed in this document applies a high potential across the photodiode terminals thus generating significant photodiode dark current and limiting the sensitivity of the system.

EP 1128170 and US 2005/0205759 each describe a method whereby the current through a photodiode is measured and compared with a reference value. The photodiode bias circuit is then adjusted according to whether the measured current is higher or lower than this pre-determined reference value. EP 1128170 describes how the photodiode bias can be adjusted over a relatively wide range to cope with large changes in the incident light level. Thus by choice of a suitable reference value the photodiode can be operated in its most sensitive region at low incident light levels, but for higher incident light levels the bias voltage may be changed so as to avoid saturation of the output signal. US 2005/0205759 particularly refers to an optical receiver in a communications system and describes how the photodiode bias voltage can be dynamically controlled so as to optimise the value of any given detection performance parameter.

US 2003/0122533 similarly describes a circuit to control the bias applied across a photodiode based on a measurement of the generated current. In this case the biasing circuitry described fulfils a requirement to vary the applied bias over a large range. The method employed for determining the bias to be set is similar to EP 1128170 and US 2005/0205759, and is based on detection of the photodiode current and the use of a feedback mechanism.

The above methods of biasing would not in general be applicable to an ALS utilising integrated thin film photodiodes. Additionally it is unclear whether a feedback mechanism involving detection of the photodiode current could facilitate sufficiently precise photodiode biasing to meet the sensitivity requirements of an ALS system using integrated thin film photodiodes.

GB 1 175 517 discloses a photosensor formed of a plurality of series-connected "photo-sensitive bodies". In operation a bias voltage is applied across the combination of the photosensor and a load resistance.

U.S. Pat. No. 5,117,099 describes a scheme whereby the currents from the detection and reference photodiodes are subtracted in the current domain. This is achieved by arranging the detection and reference photodiodes in a loop, with the anode of the detection photodiode connected to the cathode of the reference photodiode, and the cathode of the detection photodiode connected to the anode of the reference photodiode. This provides compensation for variations in ambient temperature and stray light.

DISCLOSURE OF INVENTION

A first aspect of the present invention provides a method of operating a photosensor comprising: applying a bias voltage to a photosensor comprising n photo-sensitive elements connected in series, where n is an integer greater than one; and determining the current in the photosensor at a time when the applied bias voltage across the photosensor maintains the photosensor at or close to the operating point at which it has its greatest signal-to-noise ratio.

The term "connected in series" is intended to cover any arrangement in which an anode of one photo-sensitive element is connected to a cathode of another photo-sensitive element whose anode (in the case of more than two photo-sensitive elements) is in turn connected to a cathode of a further photo-sensitive element. The term "connected in series" is intended to include the case where the n photo-sensitive elements are defined in a single semiconductor region as well as the case where the n photo-sensitive elements are defined in separate semiconductor regions.

Compared to the biasing methods of EP 1128170, US 2005/0205759 and US 2003/0122533, the photosensor is simply biased at or near its most sensitive point of operation, irrespective of the light level.

The use of multiple series-connected photo-sensitive elements has the effect of reducing the precision of biasing that is required to operate the photo-sensitive elements in their most sensitive regions. This reduction in the required biasing precision is of utmost importance when the bias circuits for photosensor are monolithically integrated on a display substrate and, for example, comprise thin film transistors (TFTs) fabricated in a polysilicon process. Such TFTs typically exhibit large process variations leading to unpredictable circuit performance. Reducing the precision of biasing required to operate the photo-sensitive elements in their most sensitive regions in the method of the invention, through the use of multiple series-connected photo-sensitive elements, reduces the biasing precision to the point where a monolithically integrated bias circuit may be used.

The method may comprise determining the current in the photosensor at a time when the applied bias voltage is equal or approximately equal to $n \times V_{bi}$, where $V_{bi}$ is the bias voltage about which the current in a single one of the photo-sensitive elements, in the dark, changes sign.

The bias voltage $V_{bi}$ is also the bias voltage at which the current in a single one of the photo-sensitive elements, in the dark, is zero.

In a case where the photo-sensitive elements are photodiodes, the bias voltage $V_{bi}$ is the "built-in voltage" of a single one of the photo-sensitive elements. As is known, the "built-in voltage" of a photodiode is the bias voltage that must be applied across the terminals of the device for the dark current to be zero. For applied biases positive of the built-in voltage a forward (positive) current results. For biases negative of the built-in voltage the diode current is in the reverse direction (a negative current). The "built-in" voltage of a photodiode is the bias voltage at which the dark current in the photodiode has its minimum value.

In a case where the photo-sensitive elements are phototransistors, a bias would be applied between the source and drain of the phototransistor such that with the device in darkness no current would flow between the source and the drain. This value of applied source to drain bias around which the current changes sign, may depend on the voltage applied to the gate of the phototransistor.

The "dark current" of a photosensor is the current generated by the photosensor when it is not illuminated; the "dark current" is also referred to as the "leakage current".

The step of applying the bias voltage may comprise applying a constant bias voltage equal or approximately equal to $n \times V_{bi}$.

The method may comprise determining the current in the photosensor at a time when the applied bias voltage across the photosensor is equal or approximately equal to zero.

The step of applying the bias voltage may comprise applying a constant bias voltage equal or approximately equal to zero.

The number n of series connected photo-sensitive elements may be ten or more. It may be twenty or more. It may be fifty or more. It may be one hundred or more.

Each photo-sensitive element may be a photodiode, for example a lateral photodiode. Alternatively, each photo-sensitive element may be a phototransistor.

Each photo-sensitive element may be a thin film photo-sensitive element. It may be a silicon thin film photo-sensitive element.

The photo-sensitive elements may be nominally identical to one another.

The method may comprise connecting the n photo-sensitive elements in series between a first input of an operational amplifier and the second input of the operational amplifier. By providing suitable feedback (such as, for example, unity gain, or an integrator), this is a convenient way of providing a zero bias voltage across the photo-sensitive elements.

The method may alternatively comprise connecting the n photo-sensitive elements in series between a first input of an operational amplifier and an output of the operational amplifier. By providing suitable feedback (such as, for example, unity gain), this is a convenient way of providing a zero bias voltage across the photo-sensitive elements.

A second aspect of the present invention provides a method of operating a display device comprising the steps of: sensing an ambient light intensity according to a method of the first aspect; and controlling the intensity of a backlight of the display device in accordance with an output from the photosensor.

A third aspect of the invention provides a light-sensing system comprising: a photosensor comprising n photo-sensitive elements connected in series, where n is an integer greater than one; bias means for applying a bias voltage to the photosensor; and determining means for determining the current in the photosensor at a time when the applied bias voltage across the photosensor maintains the photosensor at or close to the point at which it has the greatest signal-to-noise ratio.

The bias means may be adapted to maintain a constant bias voltage across the photosensor irrespective of the light level on the photosensor.

The determining means may be adapted to determine the current in the photosensor at a time when the bias means applies a bias voltage across the photosensor that is equal or approximately equal to $n \times V_{bi}$, where $V_{bi}$ is the bias voltage about which the current in a single one of the photo-sensitive elements, in the dark, changes sign.

The bias means may apply, in use, a constant bias voltage equal or approximately equal to $n \times V_{bi}$.

The determining means may be adapted to determine the current in the photosensor at a time when the bias means applies a bias voltage across the photosensor that is equal or approximately equal to zero.

The bias means may be adapted to apply a constant bias voltage equal or approximately equal to zero.

The number n of series connected photo-sensitive elements may be ten or more. It may be twenty or more. It may be fifty or more. It may be one hundred or more.

The system may further comprise a second photosensor connected in parallel to the first photosensor, the second photosensor comprising n photo-sensitive elements connected in series, wherein the second photosensor is connected in an opposite sense to the first photosensor.

At least one cross-connection may be provided between an inter-element node of the first photosensor and a corresponding inter-element node of the second photosensor.

Each photo-sensitive element may be a photodiode. It may be a lateral photodiode.

Each photo-sensitive element may be a phototransistor.

Each photo-sensitive element may be a thin film photo-sensitive element.

Each photo-sensitive element may be a silicon thin film photo-sensitive element.

The photo-sensitive elements may be nominally identical to one another.

The n photo-sensitive elements may be connected in series between a first input of an operational amplifier and the second input of the operational amplifier.

The n photo-sensitive elements may be connected in series between a first input of an operational amplifier and an output of the operational amplifier.

The bias means and the determining means may be comprised in a single circuit.

A fourth aspect of the invention provides a display system comprising: a display device having a backlight; a photosensing system of the third aspect for sensing an ambient light intensity; and a controller for controlling the intensity of the backlight of the display device in accordance with an output from the photosensing system.

Preferred embodiments of the invention will be described with reference to the accompanying figures.

BEST MODE FOR CARRYING OUT THE INVENTION

The basic concept of the invention is two-fold. Firstly, the invention comprises measuring the photo-generated current of a photo-sensing element whilst maintaining the photo-sensing element at or close to the point at which it has the greatest signal-to-noise ratio. Secondly, an arrangement of multiple photo-sensing elements connected in series is used to ease the biasing requirements, so that a monolithically integrated bias circuit may be used.

The invention will be described with reference to examples in which the photo-sensitive elements are photodiodes. However, the invention is not limited to the use of photodiodes and other photo-sensitive elements may be used such as, for example, phototransistors.

Figure 3:
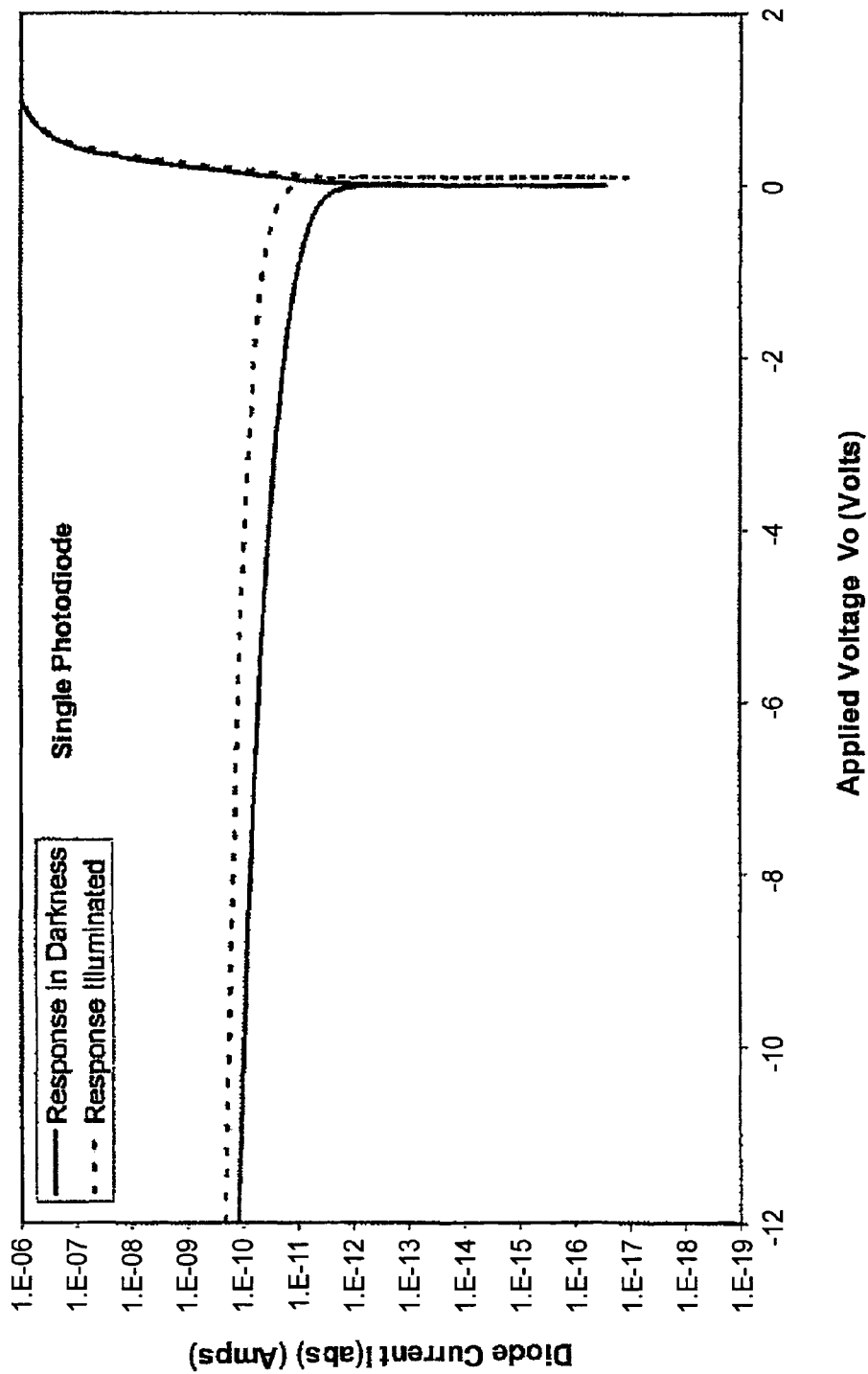
FIG. 3 illustrates typical current-voltage (I-V) characteristics of the lateral p-i-n photodiode of FIG. 1, in darkness and when illuminated.

The sensitivity of a photodiode is maximised when the ratio of the photocurrent generated when the photodiode is illuminated to the leakage current (or dark current) when the photodiode is not illuminated is maximised. FIG. 3 shows typical I-V characteristics of a photodiode, with the photocurrent shown as a broken line and the leakage current shown as a full line. It can be seen that the ratio of the photocurrent to the leakage current is greatest when the applied bias is very close to zero volts.

Figure 4:
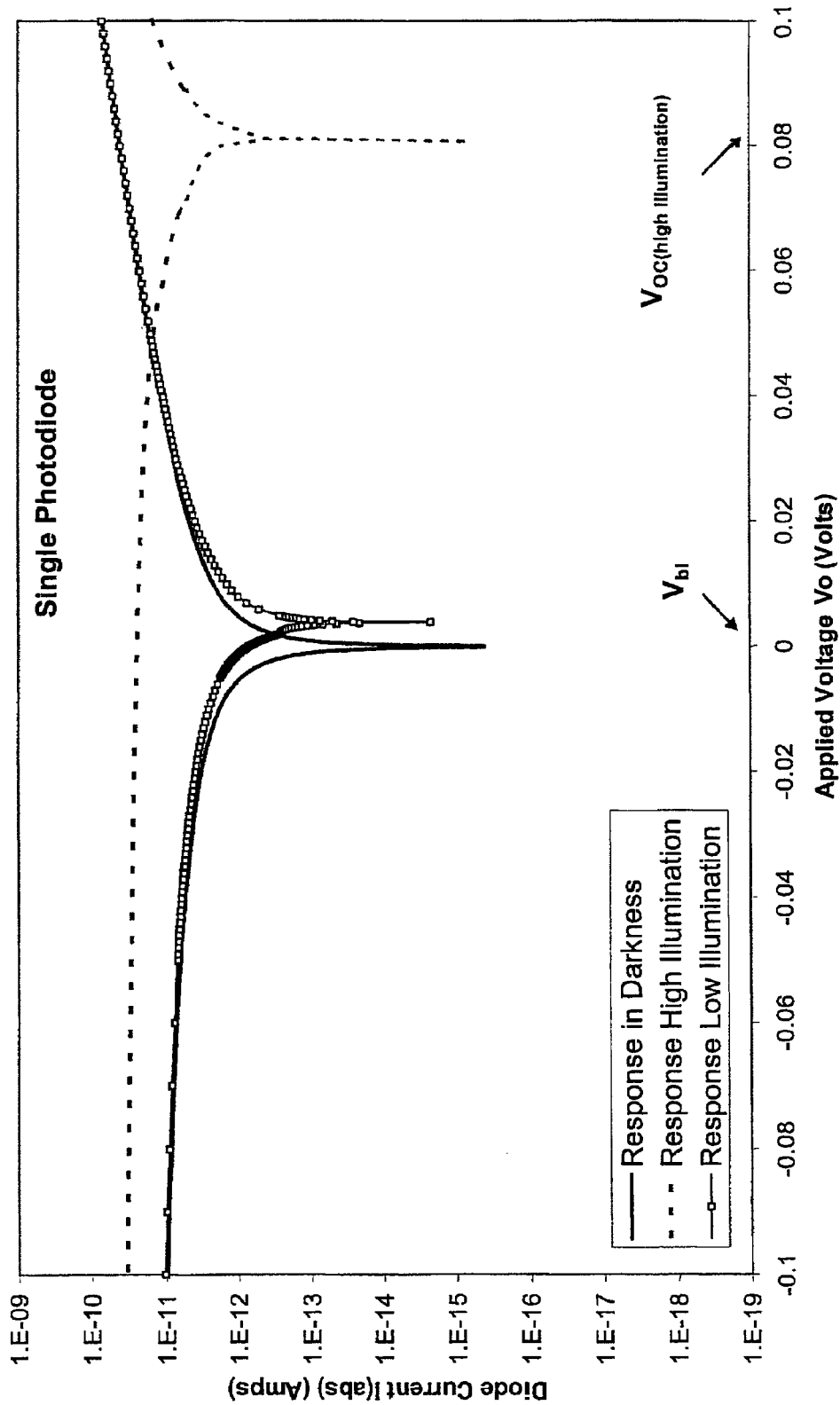
FIG. 4 is a partial enlarged view of the I-V characteristic of FIG. 3.

FIG. 4 is a partial enlarged view of typical I-V characteristics of a photodiode, for applied bias voltages close to zero volts. The full line is the leakage current (ie, the response in darkness), the broken line is the photocurrent for a high illumination level, and the squared line is the photocurrent for a low illumination level. The leakage current (full line) and the photocurrent for a high illumination level (broken line) in FIG. 4 correspond to the leakage current and photocurrent shown in FIG. 3.

It can be seen that that the magnitude of the leakage current has a very narrow trough with its minimum at a bias voltage corresponding to the built-in voltage, $V_{bi}$, of the diode. For a polysilicon thin-film photodiode, $V_{bi}$ has a value very close to zero volts. The minimum in the leakage current for a bias voltage equal to $V_{bi}$ corresponds to the point at which the direction of the leakage current, with the device in darkness, changes sign. The photocurrent has a similar minimum where it too changes sign but crucially this occurs for a different applied bias—the minimum in the photocurrent occurs for bias voltage equal to the open circuit voltage denoted as $V_{OC}$. The value of $V_{OC}$ is dependent on both the light level (as can be seen in FIG. 4) and the temperature.

Figure 5:
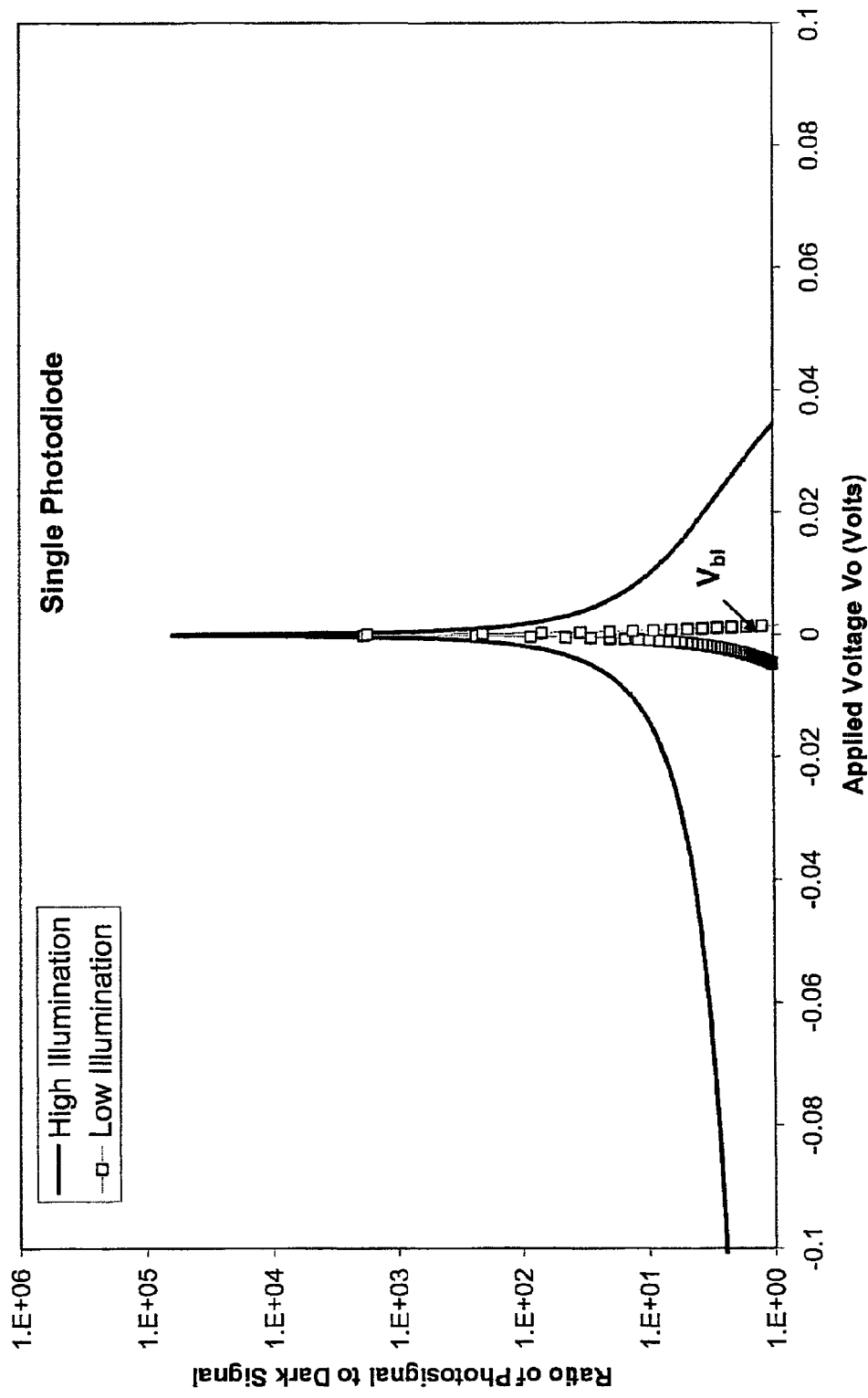
FIG. 5 illustrates a typical ratio of photo-generated current to dark current as a function of the applied bias for the lateral p-i-n photodiode of FIG. 1.

FIG. 5 shows the signal-to-noise ratio (SNR), which is defined as the ratio of the photocurrent to the leakage current, for a photodiode having the I-V characteristics shown in FIG. 3. FIG. 5 shows two curves for the SNR, and these are for the high and low illumination levels of FIG. 4. It can be seen that if the photodiode is biased close to the built-in voltage $V_{bi}$ the signal to noise ratio is very high, and for operation in this region of biasing the sensitivity of the sensor is maximised.

Moreover, since the built-in voltage $V_{bi}$ is close to zero, a high signal-to-noise ratio may be obtained by biasing the photodiode at zero volts. Therefore, if the photodiode is biased at zero volts it becomes possible in principle to detect much lower incident illumination levels than would be the case for other applied bias voltages. However, in practice, a bias circuit intended to generate a bias voltage of 0V will in fact generate a non-zero bias voltage of $V_A=0\pm\delta V$ and thus, in order to fully utilise the SNR peak, $\delta V$ should be minimised. The typical width of the peak in the SNR of FIG. 5 requires that $\delta V<1$ mV in order for a dynamic range of 60 dB to be realised for this particular level of illumination. Biasing a photodiode to this degree of precision is a considerable challenge in a fully monolithic implementation where, as explained above, the bias circuit is constructed from TFTs exhibiting variations in performance arising from substantial process variation. Moreover, it is necessary for the photodiode to be biased to the necessary degree of precision over a wide range of levels of illumination and FIG. 5 shows that, as the illumination level becomes lower the SNR curve becomes narrower.

The present invention accordingly uses an arrangement of multiple photodiodes connected in series, so as to ease the precision required for the biasing voltage.

Figure 6:
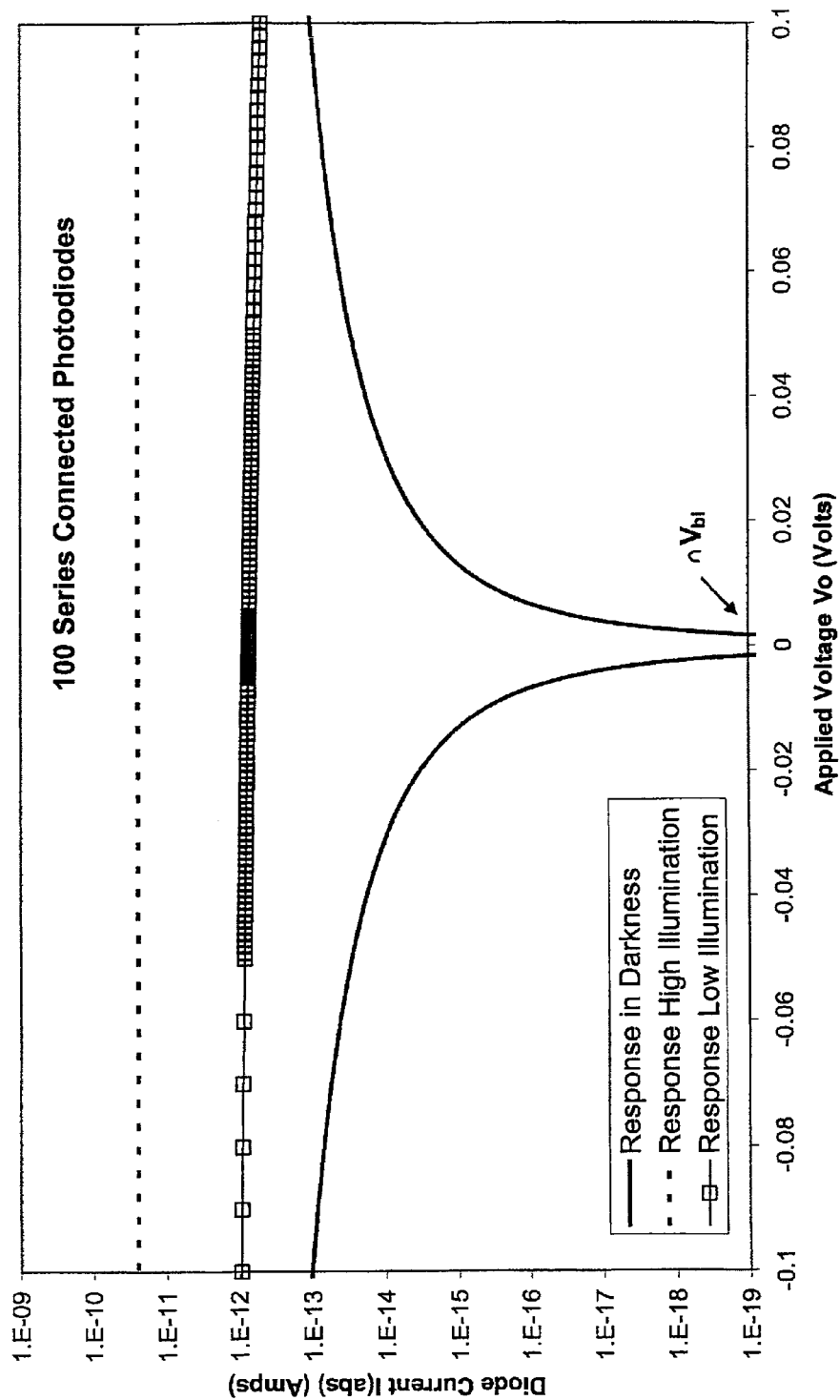
FIG. 6(a) illustrates typical current-voltage characteristics of 100 series-connected lateral photodiodes, in darkness and when illuminated.
FIG. 6(b) illustrates typical current-voltage characteristics of 10 series-connected lateral photodiodes, in darkness and when illuminated.
Figure 6:
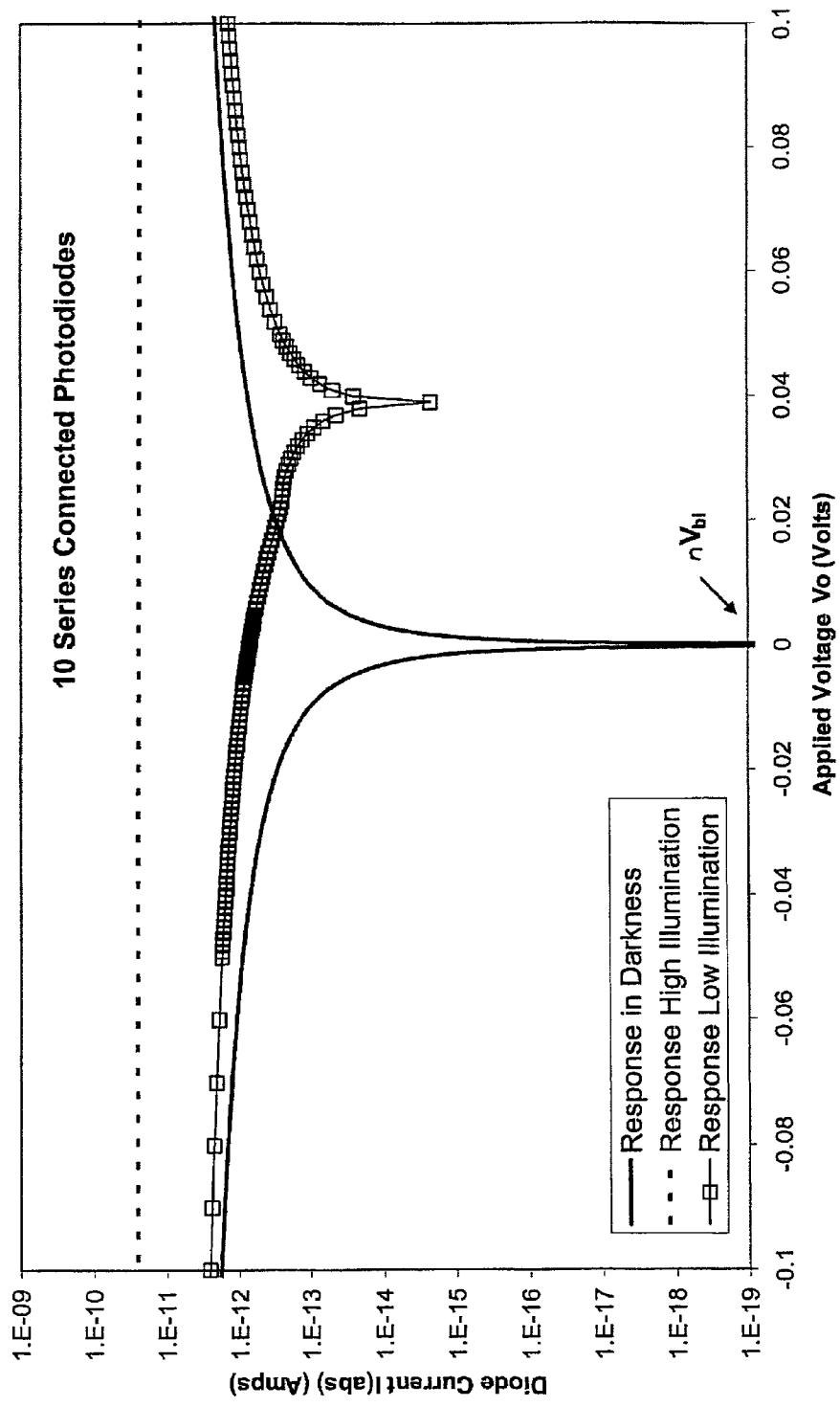

The effect of arranging several photodiodes in series can be seen by comparing FIG. 4, which shows the I-V characteristics of a single photodiode, with FIG. 6(a) which shows the I-V characteristic of 100 photodiodes connected in series—each individual photodiode has the I-V characteristics of FIG. 3 or 4. FIG. 6(a) shows the I-V characteristic in the dark, for a high illumination level, and for a low illumination level. The following features should be noted. Firstly, and most importantly, the trough in the leakage current close to a bias voltage 0V is widened. Secondly, the open circuit voltage under illumination conditions is increased (to above the maximum bias voltage shown in FIG. 6(a)). Thirdly, the photocurrent for an applied bias voltage of $V_A=0V$ is unchanged by arranging multiple photodiodes in series. The photocurrent when the array of photodiodes is biased at $V_A=0V$ is proportional to the illumination level, but is independent of the number of photodiodes connected in series.

Figure 7:
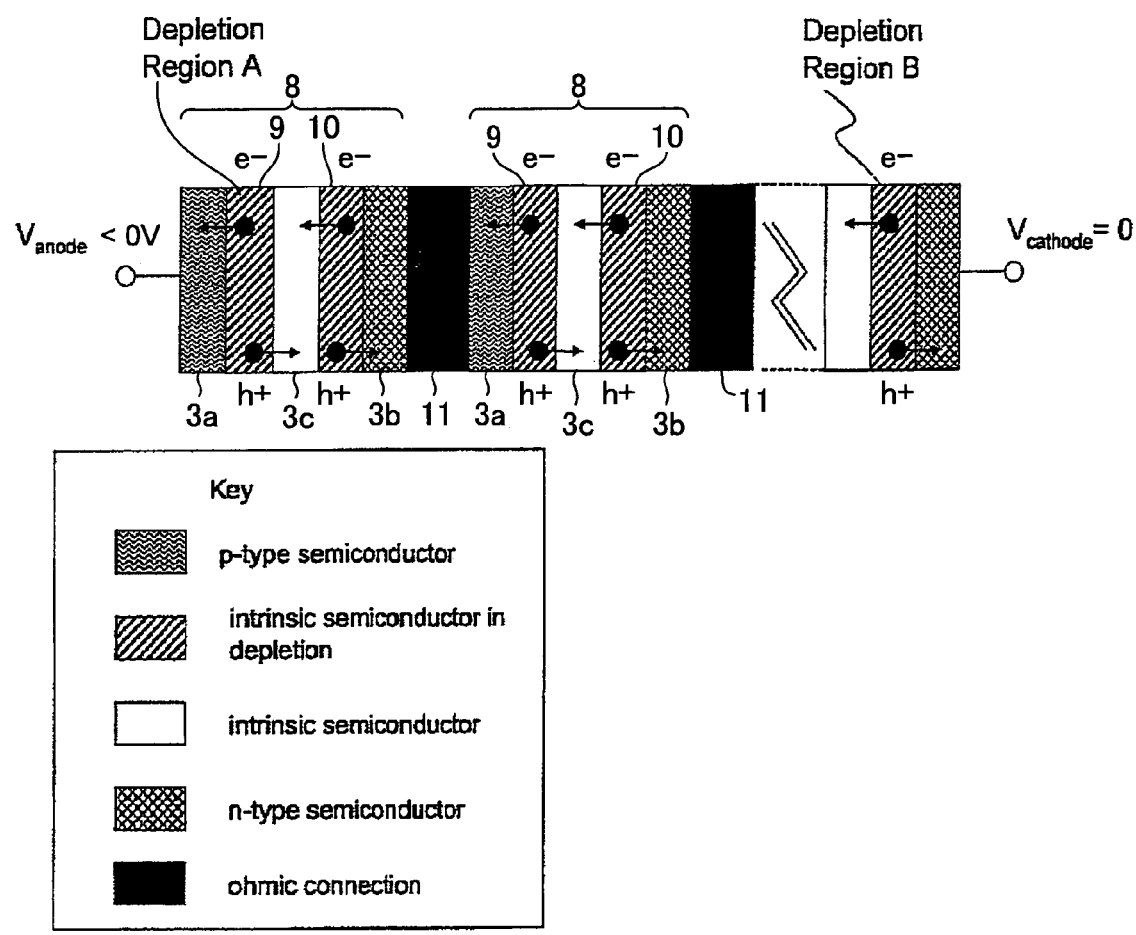
FIG. 7 shows schematically the arrangement of the depletion regions and the motion of generated carriers for series-connected lateral photodiodes.

These phenomena can be explained with reference to FIG. 7, which is a schematic illustration of the operation of series-connected lateral p-i-n photodiodes. Each photodiode 8 comprises a p-type silicon region 3a and an n-type silicon region 3b, separated by an intrinsic silicon region 3c. Two depletion regions 9, 10 are formed in each photodiode, one at the interface between the p-type silicon region 3a and the intrinsic region 3c and the other at the interface between the n-type silicon region 3b and the intrinsic region 3c—so, with n photodiodes connected in series, a total of 2n depletion regions are formed, two for each photodiode. Each photodiode is connected to the neighbouring photodiode(s) by an ohmic connection 11. (Although the above description refers to "series-connected photodiodes", the photodiodes 8 are in practice formed by suitably doping regions of a silicon layer to define the p-type regions 3a, the n-type regions 3b, and the ohmic regions 11.)

Figure 1:
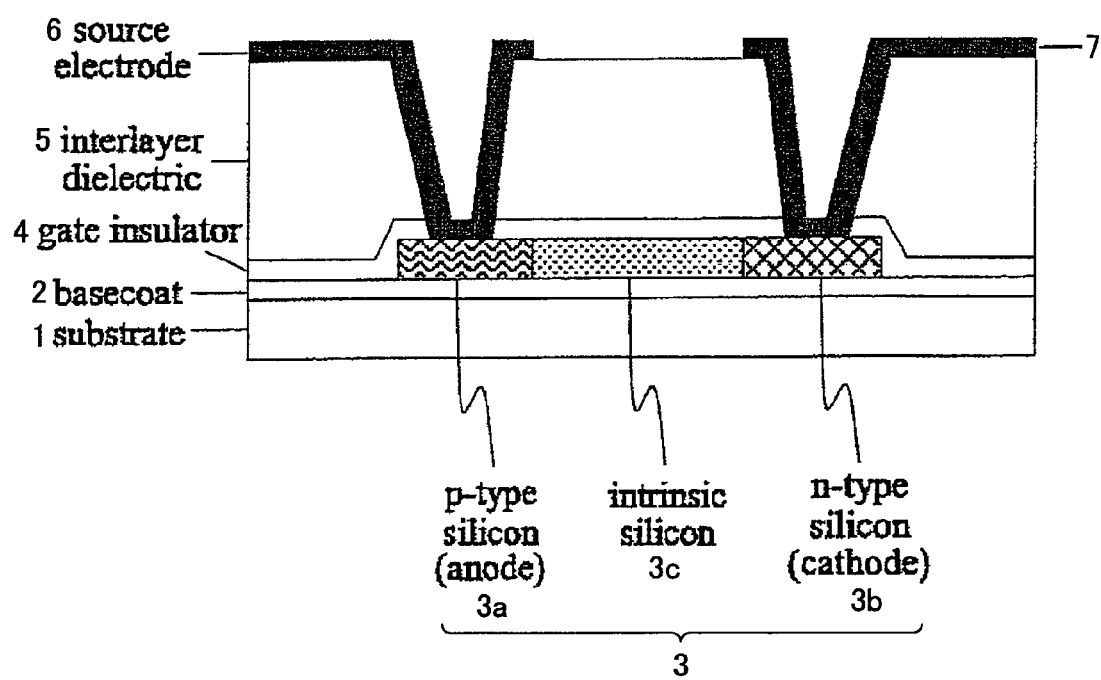
FIG. 1 is a cross-section view of a lateral p-i-n photodiode.
Figure 2:
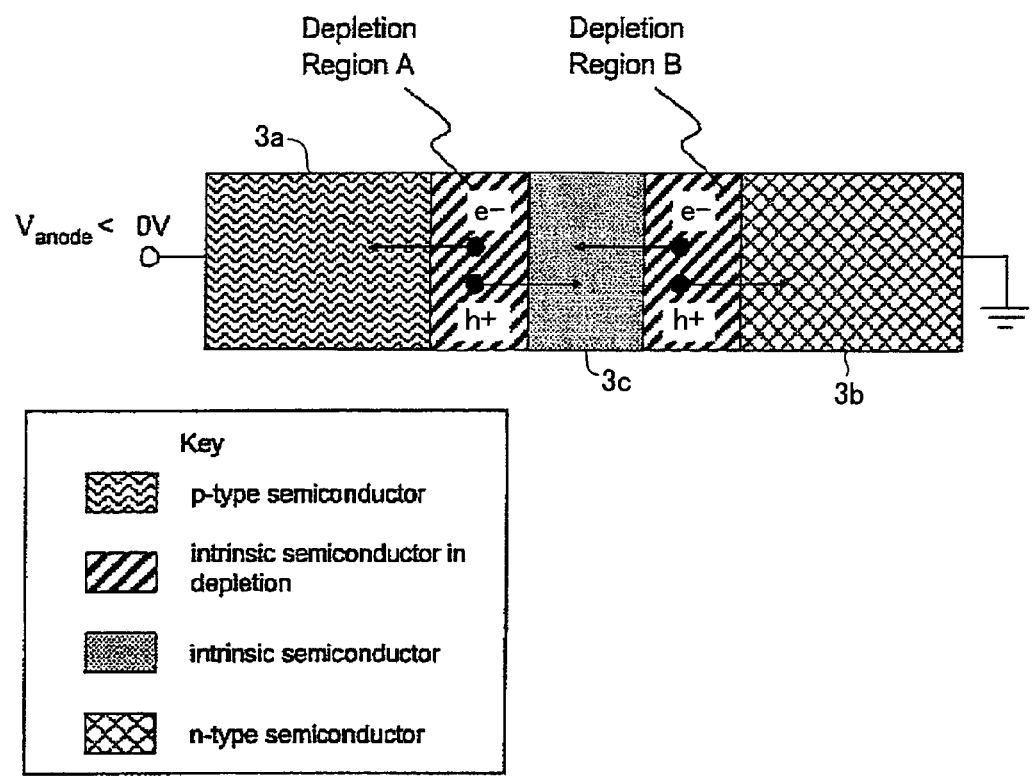
FIG. 2 illustrates operation of the lateral p-i-n photodiode of FIG. 1.

When the device is illuminated some of the incident photons are absorbed in the semiconductor material via the photoelectric effect, which each photon that is absorbed creating (at least) one electron-hole pair. However, a key point to note is that the only net contributions to the total current will come from electrons generated in Depletion Region A at the left hand end of FIG. 7 or holes generated in Depletion Region B at the left hand end of FIG. 7. All other carriers, whether generated thermally or by absorbed photons, will have a very high probability of recombining in the intrinsic regions that separate the depletion regions. Putting multiple photodiodes in series therefore does not increase the photocurrent generated when the array of series-connected photodiodes is illuminated—by comparing FIG. 2 and FIG. 7 it can be seen that two depletion regions contribute to the photocurrent in both cases. Comparing FIG. 4 and FIG. 6(a) also shows that the photocurrent generated when 100 series-connected photodiodes biased at 0V are illuminated is indeed approximately equal to the photocurrent generated when one photodiode biased at 0V is illuminated.

However, by series-connecting n photodiodes and applying a bias voltage $V_A$, the total bias voltage dropped across each individual depletion region has been reduced by a factor n in comparison to applying the bias voltage $V_A$ across a single photodiode. This reduction in the bias voltage also has the effect of reducing the electric field through each depletion region. As a consequence thermally generated carriers are swept apart with a much smaller drift velocity and have therefore a much higher probability of recombining before they leave the depletion region. Therefore for the n series-connected photodiodes the trough in the leakage current around the built-in voltage $V_{bi}$ is significantly broadened—that is, for a bias voltage close to 0V, the leakage current for the n series-connected photodiodes is significantly lower than the leakage current for one photodiode. This may be seen by comparing the leakage current (full curve) for a bias voltage of close to zero for one photodiode shown in FIG. 4 with the leakage current (full curve) for 100 series-connected photodiodes biased close to zero shown in FIG. 6(a).

As explained above, the photocurrent has a minimum that is not centred on $V_{bi}$, but rather that is centred on the open circuit voltage $V_{OC}$. The effect of putting n photodiodes in series is that $V_{OC}$ is increased by a factor of n since an open circuit voltage is dropped across each photodiode.

As can be seen from FIGS. 4 and 6(a), connecting 100 photodiodes in series has increased the signal-to-noise ratio for values of the bias voltage close to 0V. Moreover, the minimum in the leakage current close to a bias voltage 0V is widened. In FIG. 6(a), for example, a leakage current of $10^{-15}$ A or below, leading to a ratio of photocurrent: leakage current of $10^4$:1 or above, may be obtained with bias voltages over a range of approximately 0.015V. Thus, the arrangement of multiple photodiodes in series eases the precision required for the bias circuit to an achievable level. A further advantage is that the photocurrent becomes less dependent on the applied bias voltage for bias voltages close to 0V. This has the advantage of making the detected photocurrent more reproducible in circumstances where the exact value of the bias voltage is not known a priori.

These advantages may also be seen in FIG. 8(a), which shows the ratio of the photocurrent to the leakage current (i.e. the signal-to-noise ratio SNR) for 100 series-connected photodiodes, as a function of the applied bias voltage. FIG. 8(a) shows the SNR for both the high illumination level and the low illumination level of FIG. 6(a). It can be seen that the magnitude of the peak in the SNR has been increased, and the width of the peak has been broadened, compared to the SNR curve for a single photodiode shown in FIG. 5.

The use of series-connected or stacked photodiodes is known. However, in the prior art series-connection/stacking has been used as a means for increasing the magnitude of the generated photocurrent. In the present invention, however, series-connecting the n photodiodes is used to reduce the precision with which the photosensor must be biased to obtain the greatest signal-to-noise ratio, and also to increase the maximum value of the signal-to-noise ratio.

Figure 9:
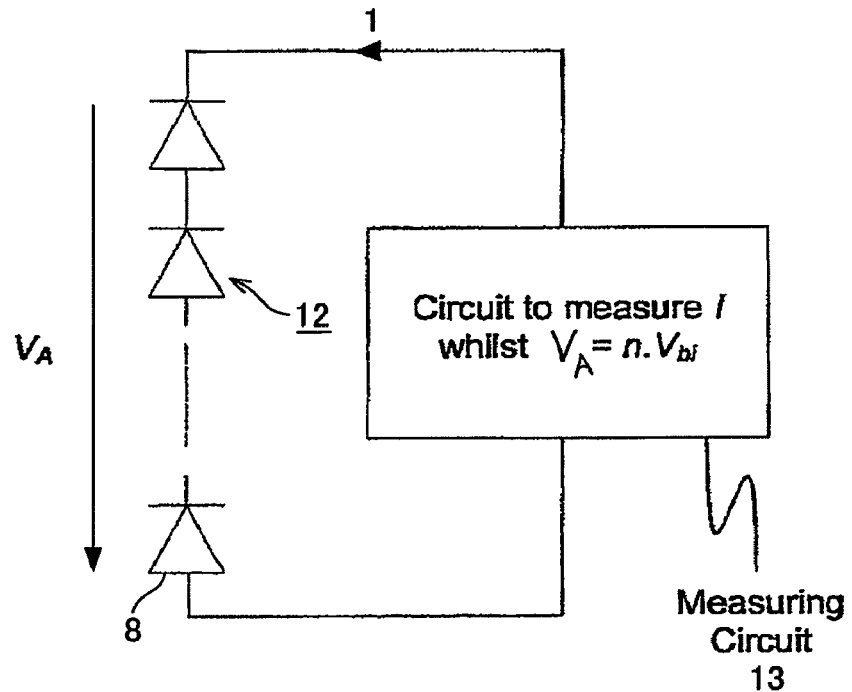
FIG. 9 illustrates a light-sensing system according to a first embodiment of the invention.

FIG. 9 is a schematic illustration of a light-sensing system according to one embodiment of the present invention. A light-sensing system of the invention comprises a photosensor comprising n (n>1) photo-sensitive elements connected in series, bias means for applying a bias voltage to the photosensor, and determining means for determining the current in the photosensor at a time when the applied bias voltage across the photosensor maintains the photosensor at or close to the point at which it has the greatest signal-to-noise ratio.

In this embodiment a plurality of n photodiodes 8 are connected in series to form a series-connected photodiode array 12. In this embodiment the bias means for applying a bias voltage to the photosensor and the determining means for determining the current in the photosensor are comprised in a single circuit, the measuring circuit 13 of FIG. 9. The output terminals of the photodiode array 12 are connected to the measuring circuit 13.

The measuring circuit 13 is arranged to measure the current flowing through the photodiode array 12 at times at which the applied bias voltage across the photodiode array 12 maintains the photodiode array 12 at or close to the point at which it has the greatest signal-to-noise ratio. In a preferred implementation of this embodiment, the measuring circuit 13 is arranged to measure the current flowing through the photodiode array 12 when the bias across the photodiode array 12 is:

$$V_A = nV_{bi}$$

where n is the number of photodiodes connected in series, and $V_{bi}$ is the built-in voltage of a single photodiode.

As explained above, this embodiment provides a significant increase in sensitivity compared to the prior art. Moreover, not only does the circuit 13 maintain the operation of the photodiodes 8 in their most sensitive region, but the use of a series-connected photodiode array 12 also reduces the precision with which the circuit 13 is required to maintain the bias voltage $V_A$ at its desired value. A high dynamic range output is therefore possible even in the presence of the significant deviations from design performance associated with a circuit 13 comprised of TFTs fabricated in a polysilicon process.

The circuit 13 may maintain a constant bias voltage of magnitude $V_A = nV_{bi}$ across the photodiode array 12. Alternatively, the circuit 13 may generate a time-varying bias voltage across the photodiode array 13 provided that, firstly, the value of the bias voltage takes the value $V_A = nV_{bi}$ on occasions and that, secondly, the circuit 13 measures the current flowing through the photodiode array 12 only at times when the value of the bias voltage is equal to, or is approximately equal to, the value $V_A = nV_{bi}$.

The photodiodes 8 may be lateral photodiodes, for example p-i-n lateral photodiodes. They may be thin film photodiodes, for example silicon thin film photodiodes so that the array of photodiodes may have the general structure shown in FIG. 7.

The n photo-sensitive elements are preferably nominally identical to one another (that is, they are preferably identical to one another within the limits of manufacturing tolerance.)

The number n of photodiodes 8 in the array 12 may be chosen to provide a desired signal-to-noise ratio, and/or to ensure that the required tolerance δV in the bias voltage that maintains the signal-to-noise above a given value is greater than the likely fluctuations in the bias voltage output by the circuit 13. For application in an ALS system that is intended for use in a mobile LCD device, it is likely that the array 12 will contain at least 100 photodiodes. For less demanding application, however, the array 12 may contain fewer photodiodes than this, for example 50 or more photodiodes, 20 or more photodiodes, or 10 or more photodiodes.

In the embodiment of FIG. 9 the bias means for applying a bias voltage to the photosensor and the determining means for determining the current in the photosensor are both comprised in a single circuit, namely in the measuring circuit 13 of FIG. 9. In principle however, a bias circuit for biasing the photodiode array 12 and a determining circuit for measuring the current flowing through the photodiode array 12 may be provided as separate circuits.

In practice, thin-film lateral polysilicon photodiodes exhibit a negligibly small built-in voltage. Hence, in this and all subsequent embodiments, the approximation may be used that $V_{bi}$ is substantially equal to 0V. Thus, this embodiment may preferably be effected using a circuit 13 that provides a constant bias voltage of, or close to, 0V, or that provides a time-varying bias voltage that takes the value of 0V on occasions provided that measurement of the current flowing though the photodiode array is restricted to those times for which the bias voltage is substantially equal to 0V. For example, the circuit may provide a bias voltage that varies sinusoidally with time.

Figure 8:
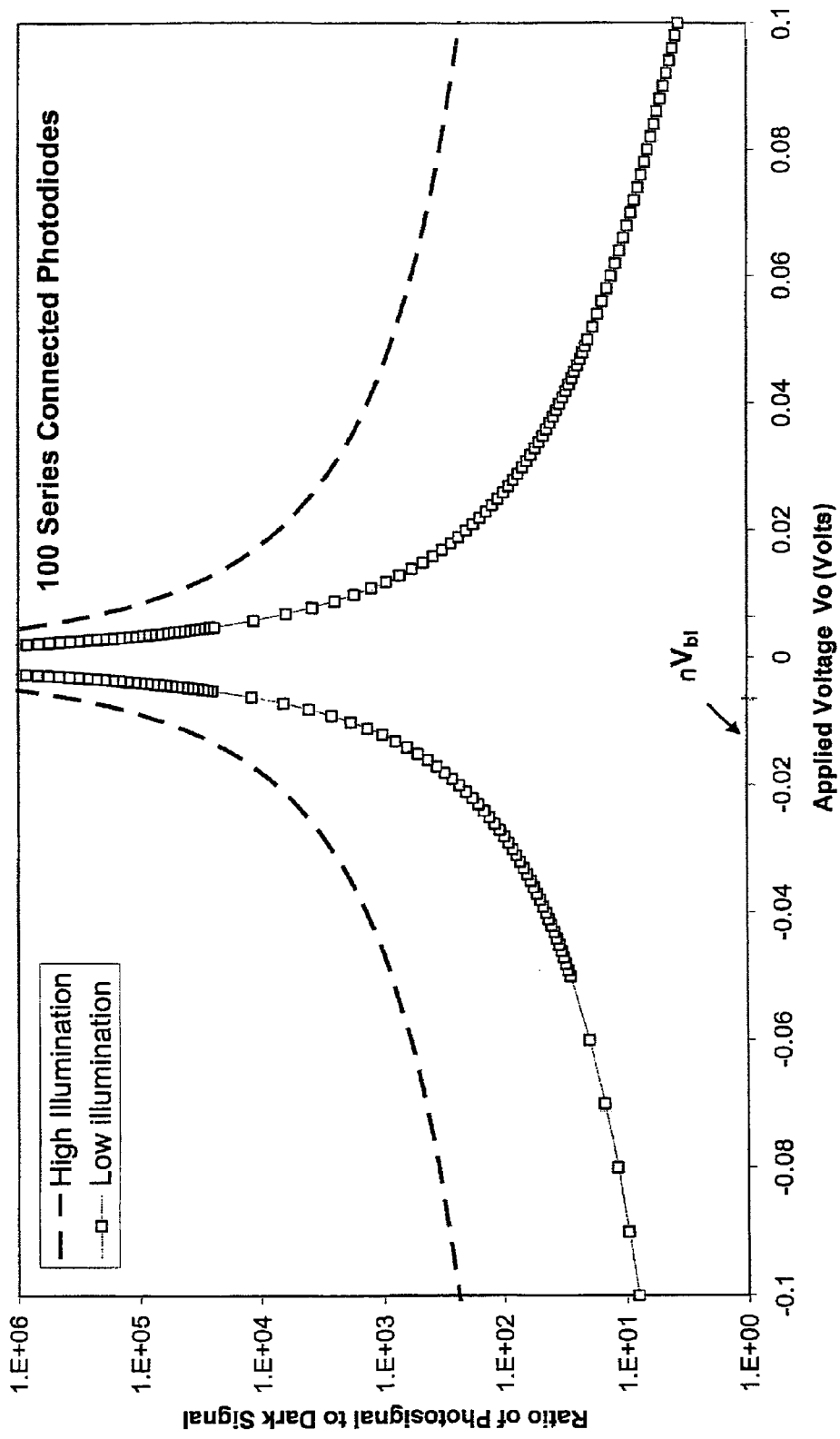
FIG. 8(a) shows a typical ratio of photo-generated current to dark current as a function of the applied bias for 100 series-connected lateral photodiodes.
FIG. 8(b) shows a typical ratio of photo-generated current to dark current as a function of the applied bias for 100 series-connected lateral photodiodes.
Figure 8:
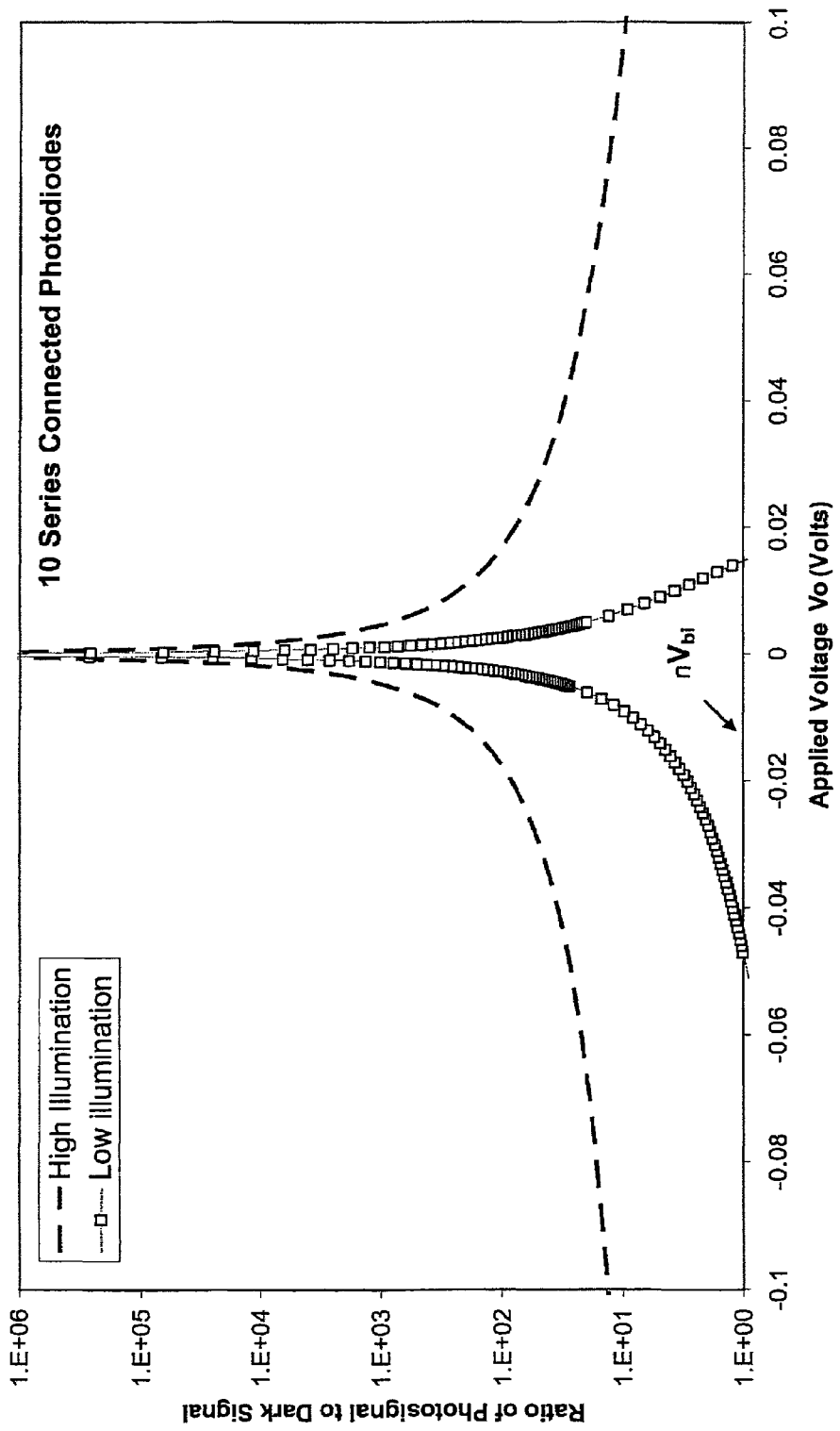

It should be noted that the amount by which the bias voltage at the time that the current flowing though the photodiode array is measured may depart from its desired value will depend on the desired ratio of the photosignal to the dark signal and on the voltage dependence of the ratio of the photosignal to the dark signal. In a case where the voltage dependence of the ratio of the photosignal to the dark signal is as shown in FIG. 8(*a*), it may be seen that the ratio of the photosignal to the dark signal exceeds $10^4$ for bias voltages in the approximate range of from −0.02V to +0.02V in the case of a high illumination level, but that the ratio of the photosignal to the dark signal exceeds $10^4$ for bias voltages in the approximate range of from −0.006V to +0.006V in the case of a low illumination level. If it were desired to operate the photosensing system such that the ratio of the photosignal to the dark signal is at least $10^4$, for any illumination level between the high illumination level of FIG. 8(*a*) and the low illumination level of FIG. 8(*b*), as an example, this would require that the bias voltage must be maintained within the range from −0.006V to +0.006V.

For design purposes, the choice of the number n of photosensitive elements to be placed in series will depend on the performance of the biasing circuitry that can be realised with the available components, for example with the available TFT components in the case of a photosensor that is to be provided on a TFT substrate. The more precise the biasing circuitry (ie, the lower the variation δV in the output bias voltage, the lower the value of n that may be used. This may be seen from FIGS. 6(*b*) and 8(*b*), which correspond to FIGS. 6(*a*) and 8(*a*) respectively but show the I-V characteristic and SNR for the case of 10 series-connected photodiodes. It can be seen that the SNR curves for 10 series-connected photodiodes shown in FIG. 8(*b*) are narrower than the SNR curves for 10 series-connected photodiodes shown in FIG. 8(*a*). This means that, for a biasing circuitry of a given precision, the use of 10 series-connected photodiodes may lead to a lower SNR than would the use of 100 series-connected photodiodes. For example, whereas biasing circuitry that can provide an output voltage of 0±0.006V would, even at the low illumination level, provide an SNR of at least $10^4$ in the case of 100 series-connected photodiodes shown in FIG. 8(*a*), this biasing circuitry could provide an SNR at the low illumination level of as low as approximately $10^1$ if used in the case of 10 series-connected photodiodes shown in FIG. 8(*b*).

In general, the following factors need to be taken into account at the design stage:

1) the number n of photosensitive elements to be placed in series—dependent on the precision of biasing that can be achieved;

2) the diode width (W)—this needs to be large enough that the small photocurrents generated at low light levels may be detected;

3) the area—which is given by n×W. The greater is the area the greater is the cost.

The choice of the optimum value for the number n of photosensitive elements to be placed in series is therefore situation-dependent, and is also dependent on the design specification.

Figure 10:
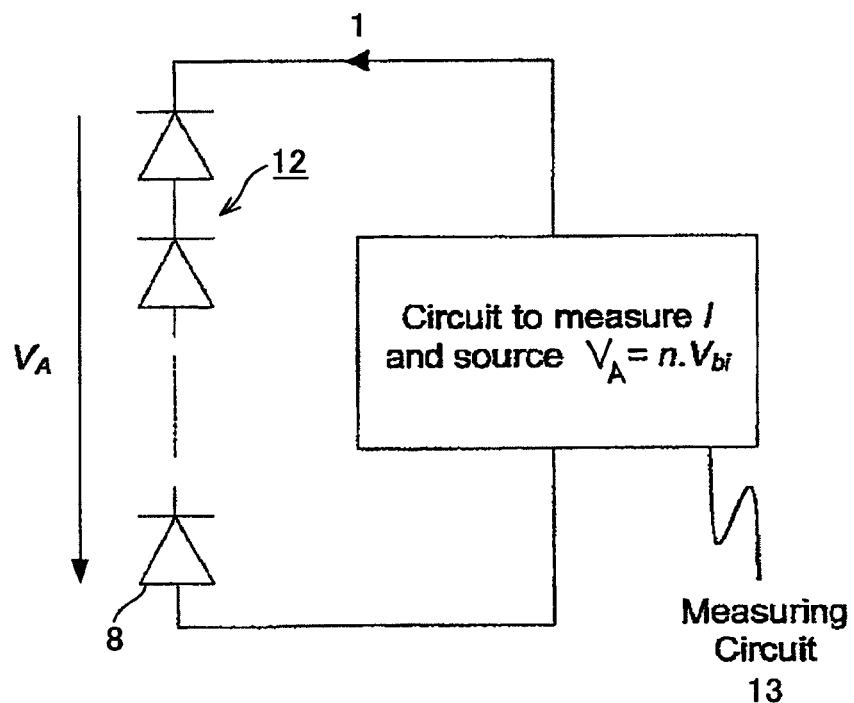
FIG. 10 illustrates a light-sensing system according to a second embodiment of the invention.

FIG. 10 illustrates a light-sensing system according to a second embodiment of this invention. This embodiment is generally similar to the embodiment of FIG. 9, except that the measuring circuit 13 is arranged to measure the current I flowing through the photodiode array 12 at times at which the bias $V_A$ across the terminals of the photodiode array 12 is equal or approximately equal to the value n $V_{bi}$ (which is approximately equal to zero. The description of features that are the same as in the embodiment of FIG. 9 will not be repeated.

In one preferred embodiment, the measuring circuit 13 is arranged to measure the current I flowing through the photodiode array 12 whilst applying a constant bias voltage $V_A$ that is equal to, or is close to, 0V across the terminals of the photodiode array 12. This embodiment is generally similar to the first embodiment, with the requirement that the bias voltage $V_A$ applied across the photodiode array 12 is constant and is explicitly maintained at $V_A=0V$ or $V_A \approx 0V$. This provides a practical way of achieving accuracy in the measurement of the photodiode current.

The advantage of this embodiment is that the current generated by the photodiode array 12 is always valid as an indication of the ambient light level incident upon the photodiode. In contrast, where a time-varying bias voltage is applied across the photodiode array 12, the current generated by the photodiode array 12 provides an indication of the ambient light level incident upon the photodiode only at times when the instantaneous value of the bias voltage $V_A$ satisfies $V_A=n V_{bi}$ (or $V_A=0$ in the assumption that $V_{bi}$ is negligible).

In the embodiments of FIGS. 9 and 10, the output of the measuring circuit may be supplied to an analogue/digital converter (not shown) to provide a digital output.

Figure 11:
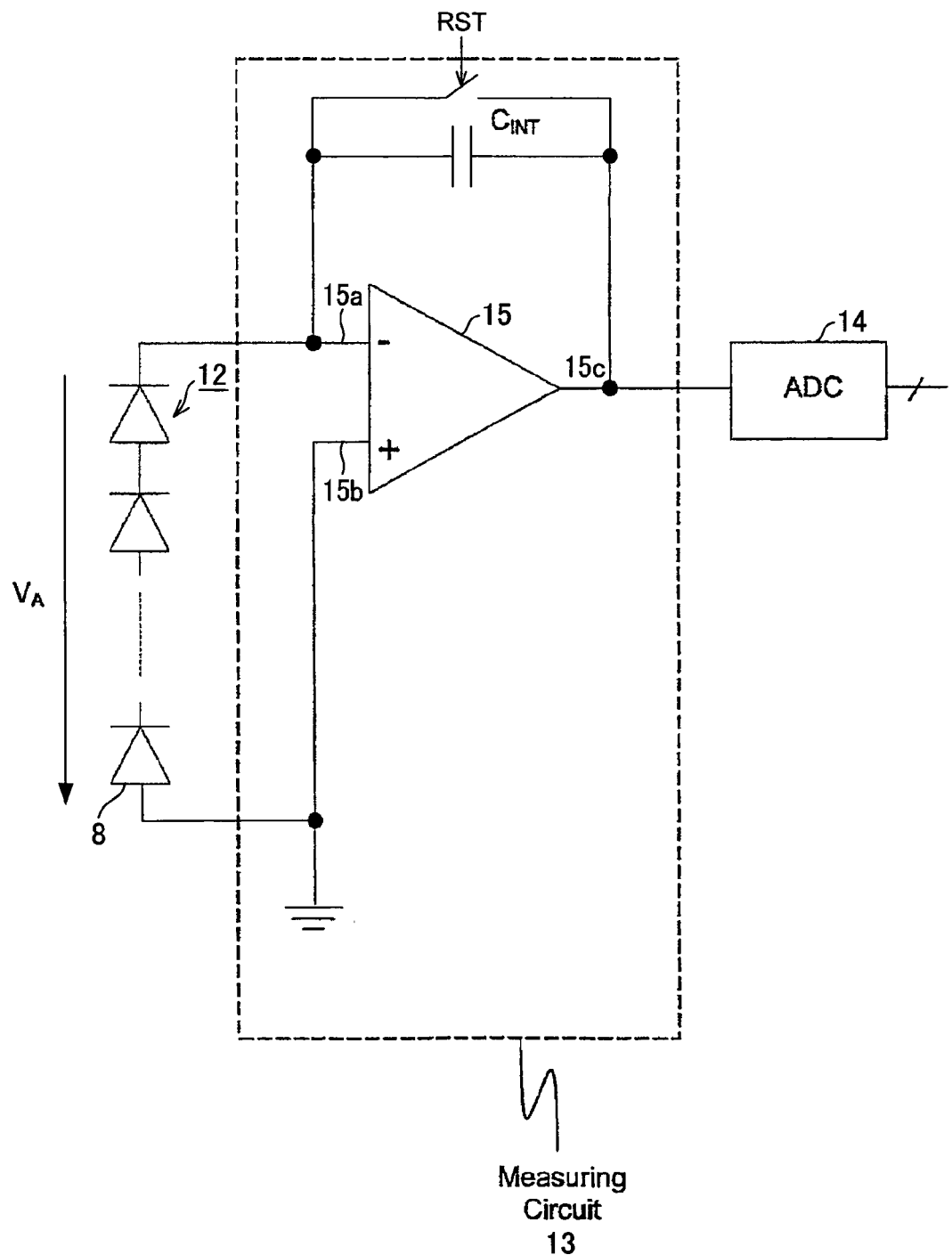
FIG. 11 illustrates a light-sensing system according to a third embodiment of the invention.

FIG. 11 illustrates a light-sensing system according to a third embodiment of this invention. The description of features that are the same as in the embodiment of FIG. 9 will not be repeated.

In the embodiment of FIG. 11 a plurality of n photodiodes 8 are again connected in series to form a series-connected photodiode array 12. The output terminals of the photodiode array 12 are connected to a measuring circuit 13. The measuring circuit 13 is arranged to measure the current flowing through the photodiode array 12 whilst maintaining a bias across the photodiode array 12. The output of the measuring circuit 13 is supplied to an analogue/digital converter (ADC) 14 to provide a digital output.

In this embodiment the measuring circuit 13 comprises an operational amplifier 15, configured as an integrator, and the photodiode array 12 is connected across the amplifier input terminals 15a,15b. Since the amplifier –ve terminal 15a is at virtual earth, and the amplifier +ve terminal 15b is earthed, the voltage applied across the photodiode array, $V_A$, is 0V.

The output terminal 15c of the amplifier (integrator) 15 is connected to earth via a switch S1. The switch S1 is controlled by a signal RST.

A capacitor $C_{INT}$ is connected between the output terminal 15c of the amplifier 15 and the amplifier –ve input 15a.

This embodiment operates as follows.

At the start of an integration period, the signal RST turns on switch S1 and the output of the integrator 15 is reset to 0V. The integration period begins when the signal RST turns off switch S1. The photocurrent is integrated on the integration capacitor $C_{INT}$.

The ADC 14 may be used to convert the output voltage to a digital value. It may be configured in either sample-and-hold or continuous time operation. In sample-and-hold configuration, the output voltage is sampled once at the end of the integration period and converted to a digital value. In continuous time operation, the ADC is configured to compare the integrated voltage to a fixed reference. The time taken for the integrated voltage to reach this reference is measured by a digital counter which provides the ADC output value at the end of the integration period.

An advantage of this embodiment is that it provides a simple method for sourcing a bias voltage substantially equal to zero volts across the terminals of the photodiode array 12 and measuring the average photodiode current generated within the chosen integration period. A further important advantage is that this embodiment can be implemented with standard elements that are available in a standard TFT process.

Figure 12:
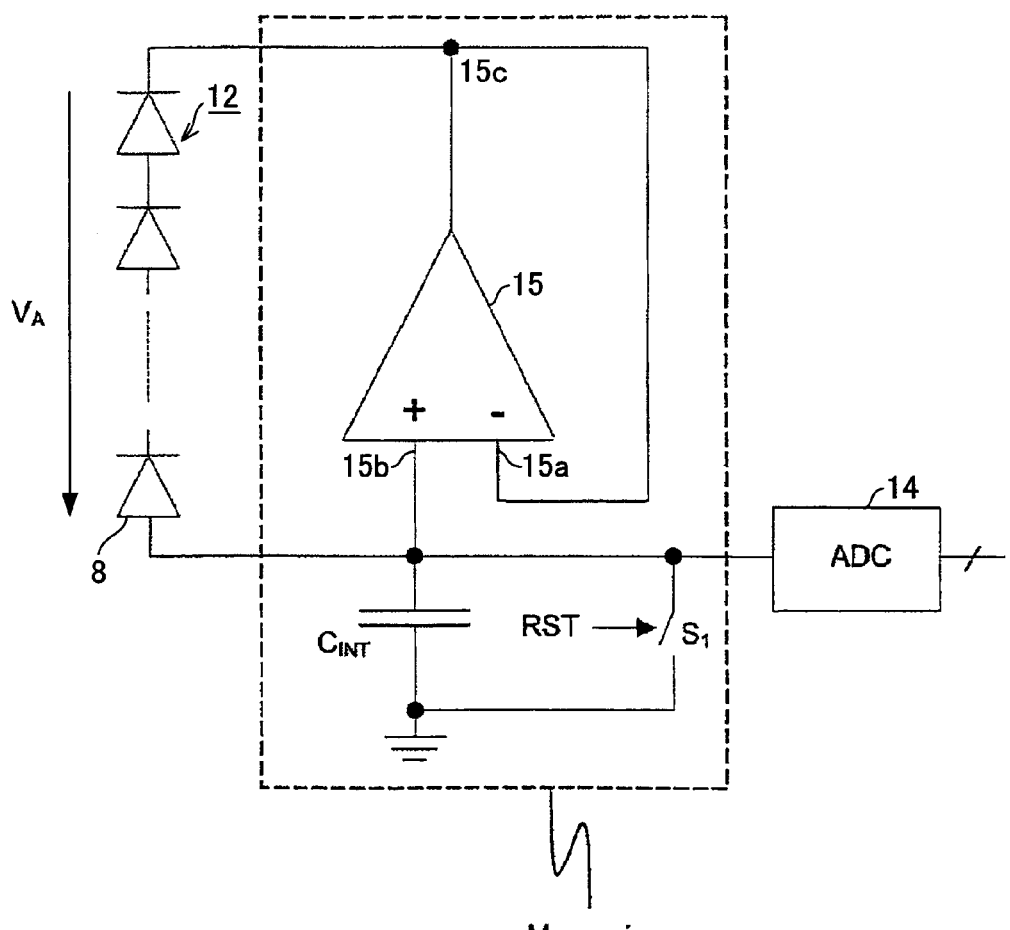
FIG. 12 illustrates a light-sensing system according to a fourth embodiment of the invention.

FIG. 12 illustrates a light-sensing system according to a fourth embodiment of this invention. The description of features that are the same as in the embodiment of FIG. 9 will not be repeated.

In this embodiment a plurality of n photodiodes 8 are again connected in series to form a series-connected photodiode array 12. The output terminals of the photodiode array 12 are connected to a measuring circuit 13. The measuring circuit 13 is arranged to measure the current flowing through the photodiode array 12 whilst maintaining a bias across the photodiode array 12. The output of the measuring circuit 13 is supplied to an analogue/digital converter (ADC) 14 to provide a digital output.

The measuring circuit further comprises an operational amplifier 15, configured as a unity-gain amplifier, an integration capacitor $C_{INT}$ connected between the +ve input terminal 15b of the amplifier 15 and earth, and a reset switch S1 connected in parallel to the integration capacitor $C_{INT}$. The photodiode array is connected between the +ve input terminal 15b of the unity gain amplifier 15 and the output 15c of the amplifier 15 such that the voltage applied across the photodiode array 12, $V_A$, is 0V. The ADC 14 is connected to the +ve input terminal 15b of the unity gain amplifier 15.

This embodiment operates as follows.

At the start of an integration period, the signal RST turns on switch S1 and the integrating terminal of the integration capacitor $C_{INT}$ is reset to 0V.

The integration period begins when the signal RST turns off switch S1. The photocurrent is integrated on the integration capacitor $C_{INT}$. As the voltage across the integration capacitor $C_{INT}$ increases the unity-gain amplifier 15 maintains the voltage across the photodiode at $V_A=0V$.

The ADC 14 may be used to convert the integrated voltage to a digital value. It may be configured in either sample-and-hold or continuous time operation. In sample-and-hold configuration, the output voltage is sampled once at the end of the integration period and converted to a digital value. In continuous time operation, the ADC is configured to compare the integrated voltage to a fixed reference. The time taken for integrated voltage to reach this reference is measured by a digital counter which provides the ADC output value at the end of the integration period.

The advantages of this embodiment are similar to the advantages of the third embodiment, in that it fulfils the requirements for sourcing a bias voltage substantially equal to 0V whilst measuring the current, and in that it can be implemented in the usual TFT process. An additional advantage in comparison to the third embodiment is that the alternative position of the integration capacitor may facilitate the bias across the photodiode being maintained at approximately 0V to a higher degree of precision.

The circuit 13 is not limited to the particular circuit embodiments shown in FIGS. 11 and 12. In principle, any circuit that prevents injection of charge across the photodiode array while maintaining a constant bias voltage of, or close to, 0V may be used.

Figure 13:
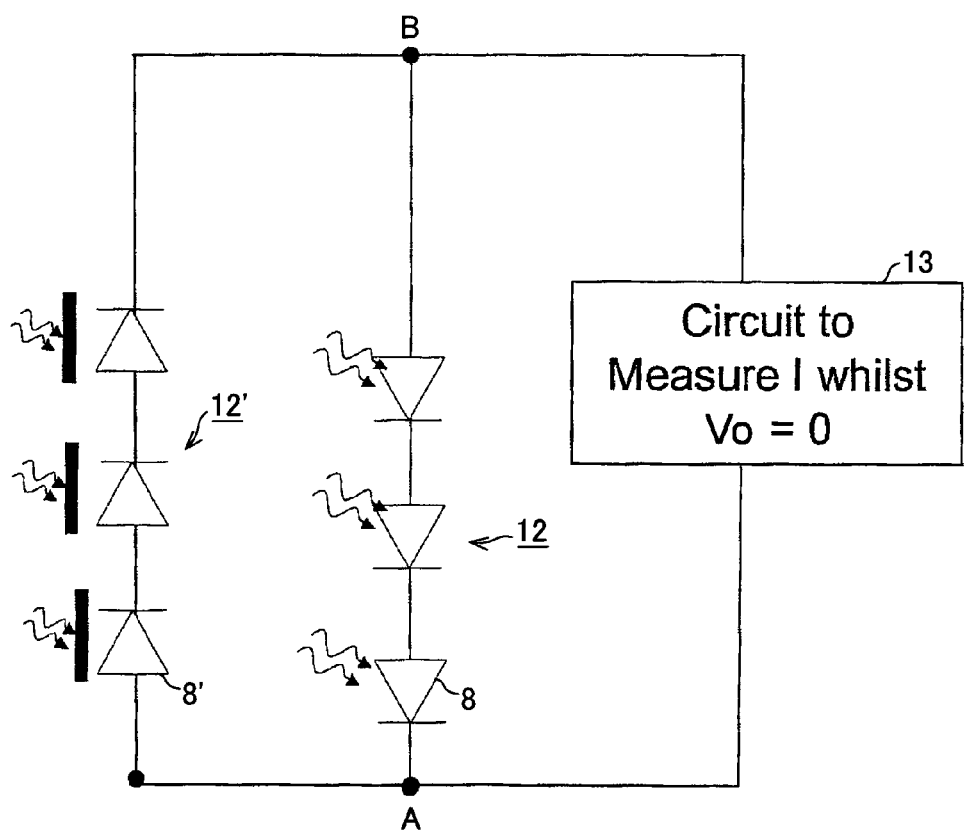
FIG. 13 illustrates a light-sensing system according to a fifth embodiment of the invention.

FIG. 13 illustrates a light-sensing system according to a fifth embodiment of this invention. The description of features that are the same as in the embodiment of FIG. 9 will not be repeated.

The light-sensing system of FIG. 13 has a photosensor 12 comprising n (where n>1) photosensitive elements 8 connected in series; the n photosensitive elements are preferably nominally identical to one another. The light-sensing system also comprises a circuit for applying a desired bias voltage to the photosensor and a measuring circuit 13 for determining the current flowing in the photosensor 12. The circuit for applying a desired bias voltage to the photosensor is not specifically shown in FIG. 13 but, as explained above, may be separate to or combined with the measuring circuit 13.

The light-sensing system of FIG. 13 further comprises a second photosensor 12' which is connected in series with the first photosensor 12. The second photosensor 12' also comprises n photosensitive elements 8' connected in series with one another. The photosensitive elements 8' of the second photosensor 12' are preferably nominally identical to one another and to the photosensitive elements 8 of the first photosensor 12. The photosensitive elements 8,8' maybe, for example, photodiodes (eg lateral photodiodes) or phototransistors.

The second photosensor 12' is connected in the opposite sense to the first photosensor 12. That is, one terminal A of the measuring circuit 13 is connected to the cathode of an end photosensitive element of the first photosensor 12 and to an anode of an end photosensitive element of the second photosensor 12', whereas the other terminal B of the measuring circuit is connected to the anode of an end photosensitive element of the first photosensor 12 and to a cathode of an end photosensitive element of the second photosensor 12'.

The photosensitive elements 8' of the second photosensor 12' are provided with a light-blocking shield 29 for blocking ambient light. The photosensitive elements 8' of the second photosensor 12' thus receive only stray light (for example from the backlight of a display), whereas the photosensitive elements 8 of the first photosensor 12 thus receive both ambient light and stray light.

Figure 14:
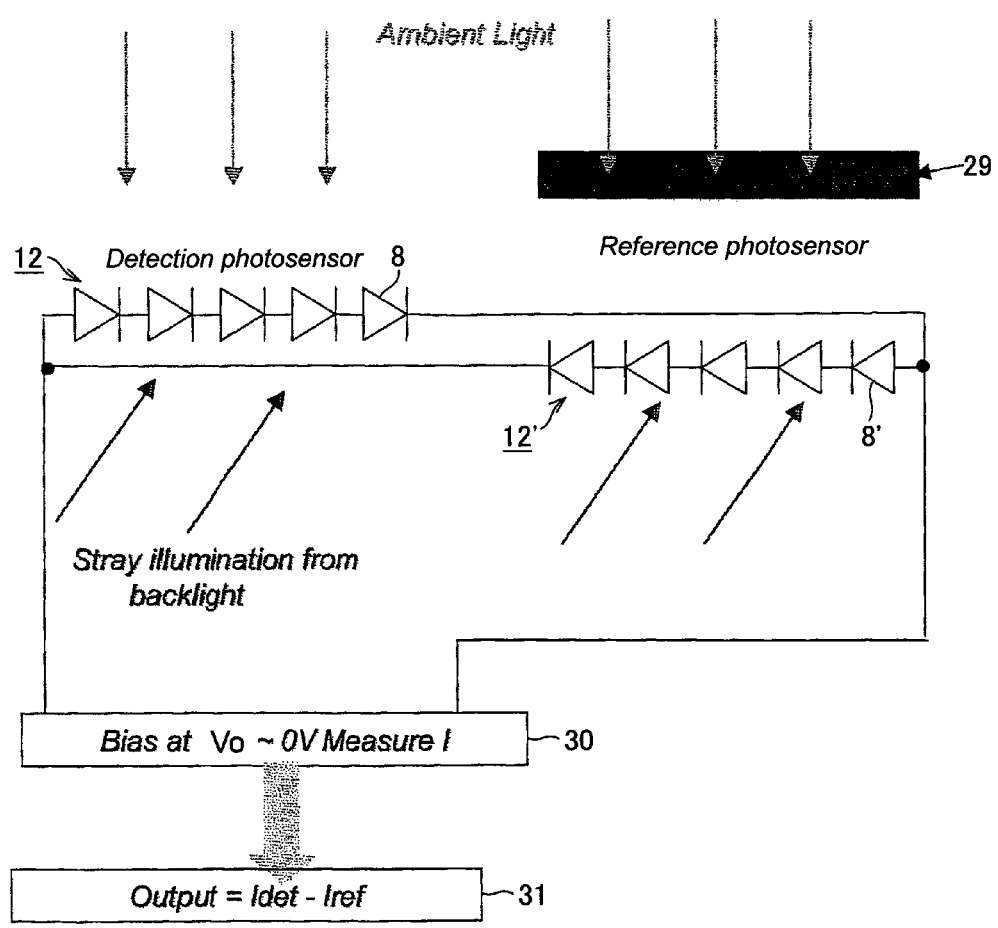
FIG. 14 illustrates the principle of operation of the light-sensing system of FIG. 13.

FIG. 14 illustrates the principle of operation of the light-sensing system of FIG. 13. As explained above, the first photosensor 12 (or "detection" photosensor) receives both stray light and ambient light, whereas the second photosensor 12' (or "reference" photosensor) receives only stray light. The provision of the two photosensors allows the effects of temperature and stray light to be compensated for—assuming that the two photosensors are identical to one another, any changes in temperature, or stray light, will affect both photosensors equally, so that any difference between the output of the first photosensor 12 and the output of the second photosensor 12' must arise from the ambient light (which is incident only on the first photosensor 12 and is not incident on the second photosensor 12').

Connecting the photosensors in opposite senses, as shown in FIG. 13 or 14, means that if the photosensitive elements of the first photosensor 12 are reverse biased, the photosensitive elements of the second photosensor 12' are forward biased (and vice versa). Moreover, if the bias circuit of the light-sensing system is arranged to provide a bias voltage of 0V, the photosensitive elements of the first photosensor and the photosensitive elements of the second photosensor 12' have the same bias voltage applied across them (and so should provide the same output current for a given light level and temperature).

The measuring circuit 13 of the light-sensing system of FIG. 13 is therefore arranged to measure the output current from the two photosensors 12,12' at times when the applied bias voltage is 0V or close thereto, as shown schematically in FIG. 30. The measured output current is the difference between the output current of the first photosensor 12 ($I_{det}$) and the output current of the second photosensor 12' ($I_{ref}$) as shown schematically at 31 in FIG. 14, which (assuming that the two photosensors are identical to one another) should be independent of the stray light level or of the temperature.

It can therefore be seen that the light-sensing system of FIG. 13 provides two advantages by measuring the measure the output current from the two photosensors 12,12' at times when the applied bias voltage is 0V or close thereto. Firstly, a high value is obtained for the ratio of the photosignal to the dark signal, giving a good signal-to-noise ratio. Secondly, it is possible to eliminate, or at least reduce, the effects of changes in temperature or stray light on the measured output current.

Figure 15:
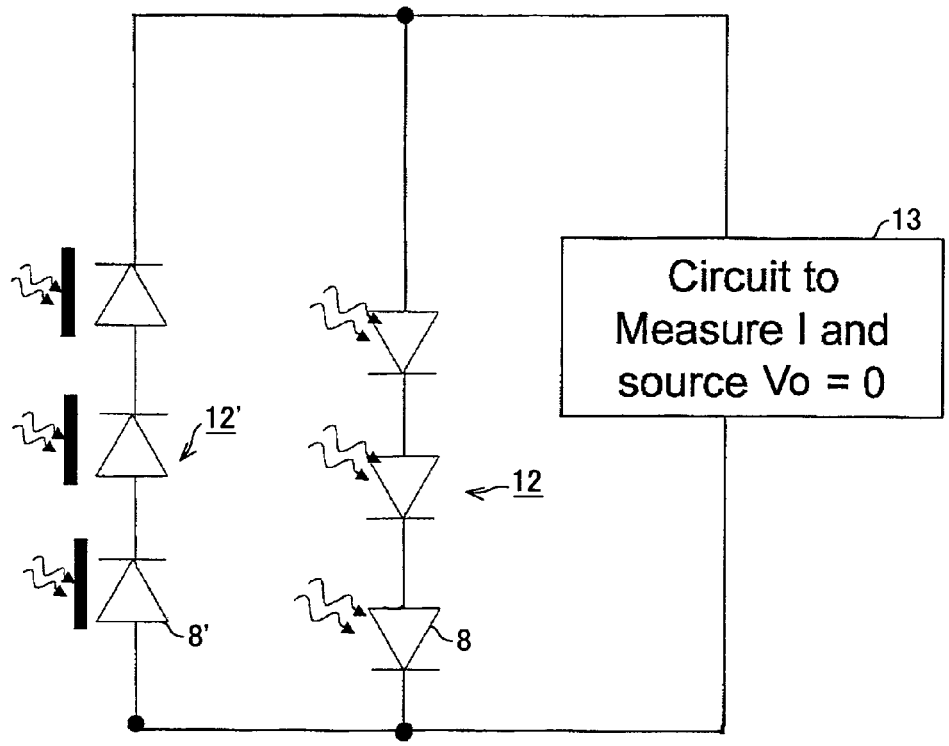
FIG. 15 illustrates a light-sensing system according to a sixth embodiment of the invention.

FIG. 15 illustrates a light-sensing system according to a sixth embodiment of this invention. The description of features that are the same as in the embodiment of FIG. 13 will not be repeated.

The measuring circuit 13 of the light-sensing circuit of FIG. 15 is adapted to provide a bias voltage to the first and second photosensors 12,12', in addition to measuring the output current at times when the applied bias voltage is zero or close thereto. For example, the measuring circuit 13 of the light-sensing circuit of FIG. 15 may provide a constant bias voltage of zero, or close thereto, or it may be arranged to provide an alternating bias voltage that periodically passes through 0V and to measure the output current at times when the bias voltage is zero or close thereto.

Figure 16:
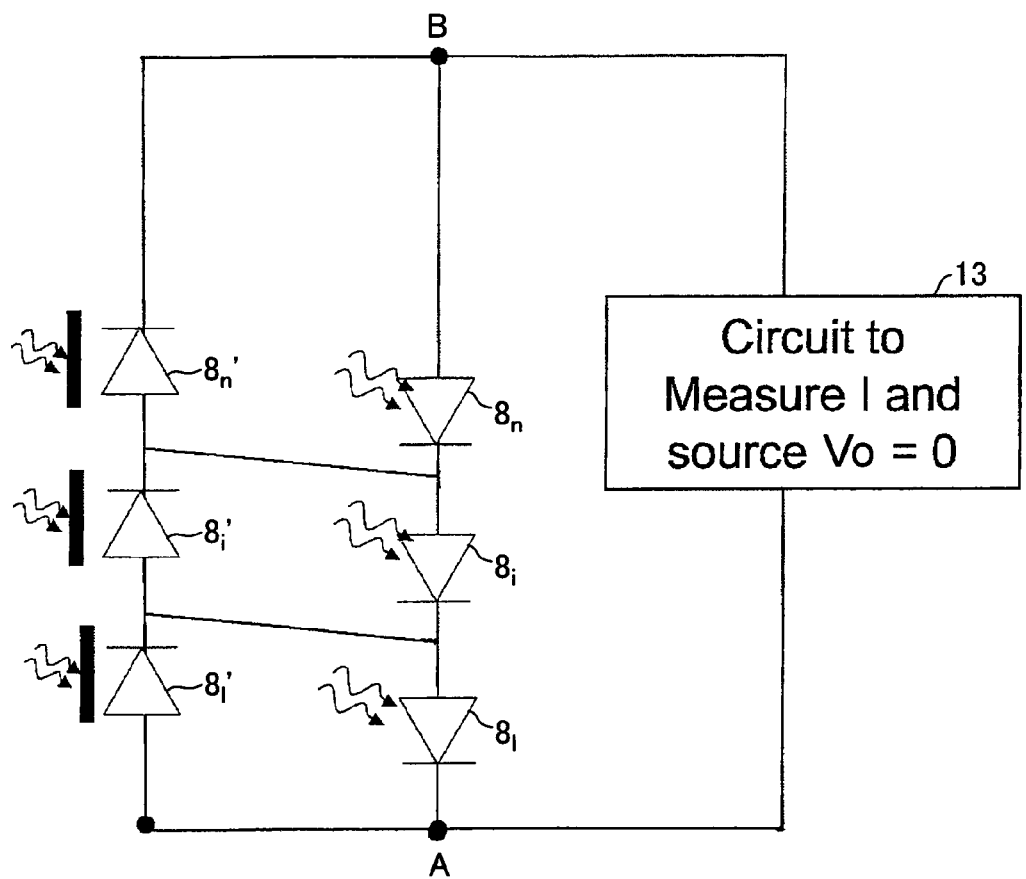
FIG. 16 illustrates a light-sensing system according to a seventh embodiment of the invention.

FIG. 16 illustrates a light-sensing system according to a seventh embodiment of this invention. The description of features that are the same as in the embodiment of FIG. 15 will not be repeated.

In the light-sensing system of FIG. 16, at least one cross-connection is provided between an inter-element node of the first photosensor and a corresponding inter-element node of the second photosensor. An inter-element node of the first photosensor is, in general terms, the node between the $i^{th}$ photosensitive element $8_i$ of the first photosensor 12 and the $(i+1)^{th}$ photosensitive element of the first photosensor 12, and the corresponding inter-element node of the second photosensor is the node between the $i^{th}$ photosensitive element $8_i'$ of the second photosensor 12' and the $(i+1)^{th}$ photosensitive element of the second photosensor 12'.

In a particularly preferred embodiment, as shown in FIG. 16, a cross-connection is provided between each inter-element node of the first photosensor and the corresponding inter-element node of the second photosensor. Thus, in the light-sensing system of FIG. 16, the anode of the first photosensitive element $8_1$ of the first photosensor 12 is connected to the cathode of the first photosensitive element $8_1'$ of the second photosensor 12'. Also, the cathode of the first photosensitive element $8_1$ of the first photosensor 12 is connected to the anode of the first photosensitive element $8_1'$ of the second photosensor 12' via the output A of the measuring circuit 13.

The cathode of the $i^{th}$ photosensitive element $8_i$ of the first photosensor 12 is connected to the anode of the $i^{th}$ photosensitive element $8_i'$ of the second photosensor 12', and is also connected to the cathode of the $(i-1)^{th}$ photosensitive element of the second photosensor 12'. The anode of the $i^{th}$ photosensitive element $8_i$ of the first photosensor 12 is connected to the cathode of the i$^{th}$ photosensitive element 8$_i$' of the second photosensor 12', and is also connected to the anode of the (i+1)$^{th}$ photosensitive element of the second photosensor 12'.

The cathode of the n$^{th}$ photosensitive element 8$_n$ of the first photosensor 12 is connected to the anode of the n$^{th}$ photosensitive element 8$_n$' of the second photosensor 12'. Also, the anode of the n$^{th}$ photosensitive element 8$_n$ of the first photosensor 12 is connected to the cathode of the n$^{th}$ photosensitive element 8$_n$' of the second photosensor 12' via the output B of the measuring circuit 13.

The additional connection(s) between the photosensitive elements 8 of the first photosensor 12 and the photosensitive elements 8' of the second photosensor in this embodiment may facilitate better performance in a case where the photosensitive elements are not exactly matched to one another.

A light-sensing system of the invention may be used to control the illumination level of a display device on the basis of the sensed ambient light intensity. For example, in the case of a display device having a backlight, the display device will in general be provided with a controller for controlling the intensity of the backlight. A light-sensing system of the invention may be provided for sensing an ambient light intensity, with an output indicative of the sensed ambient light intensity being input to the backlight controller, which controls the intensity of the backlight of the display device in accordance with the output from the light-sensing system.

Figure 17:
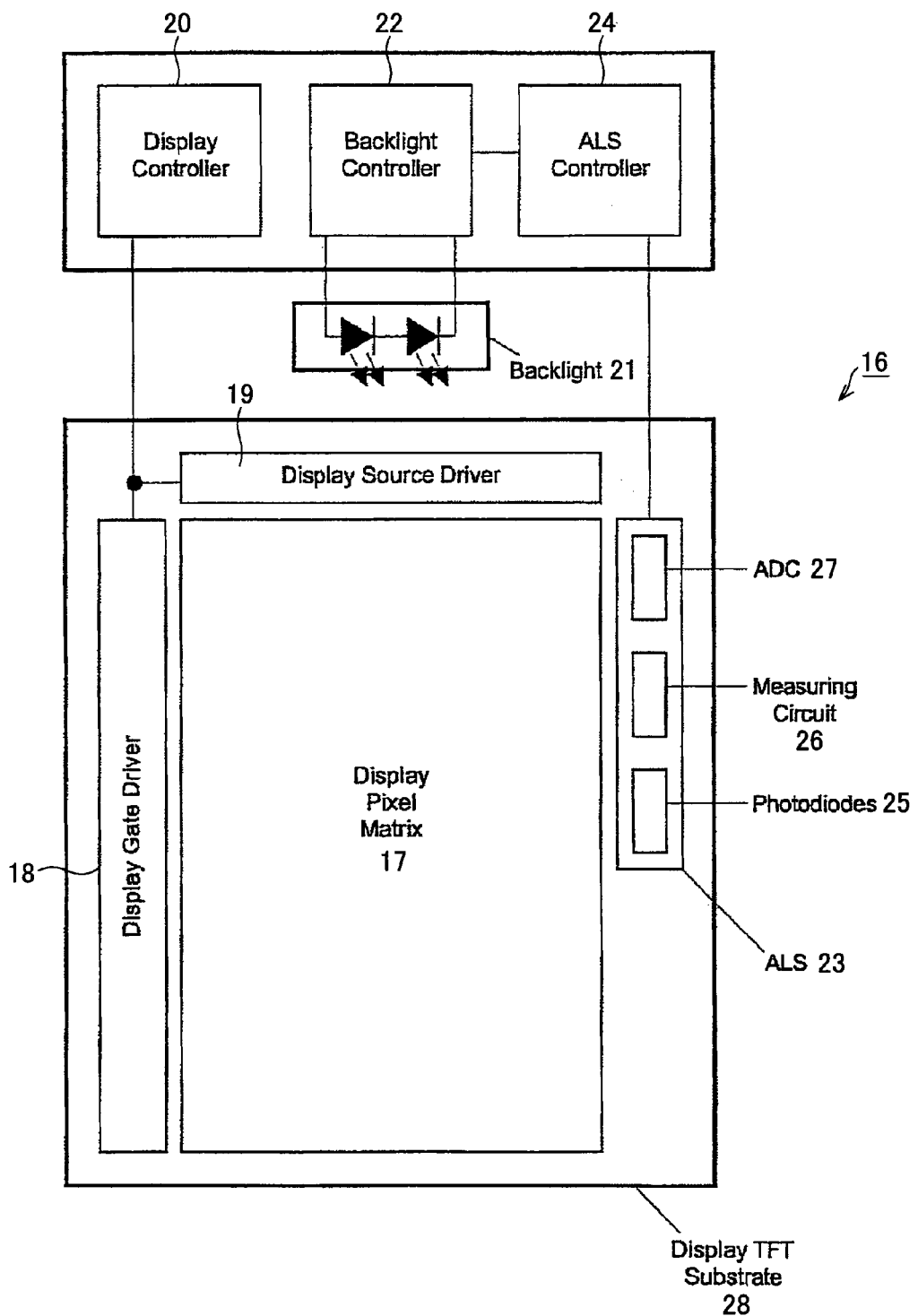
FIG. 17 shows an ambient light sensor system integrated on an AMLCD.

FIG. 17 shows an AMLCD device having an ambient light sensor system, in which the ambient light sensor system may operate according to a method of the present invention and/or may be a light-sensing system of the invention. Typically, the AMLCD device may itself be used in a number of products, such as a mobile phone or PDA.

The AMLCD 16 device consists of the following elements, as shown in FIG. 17:
 a display pixel matrix 17 (on which an image is displayed);
 display gate driver circuitry 18;
 display source driver circuitry 19;
 a display controller 20
 a backlight unit 21;
 a backlight controller 22;
 an Ambient Light Sensor (ALS) system 23; and
 an ALS controller 24.

The display pixel matrix 17, the display gate driver 18, the display source driver 19 and the ALS system 23 are provided on a display substrate 28 which may be, for example, a TFT substrate.

The ALS system 23 consists of thin-film photodiodes 25, associated measuring circuitry 26, and an Analogue-to-Digital Converter (ADC) 27. All of these components may be integrated onto the TFT substrate 28. The thin film photodiodes may be connected in series as described above, and the measuring circuit 26 may operate as described above with reference to any of FIGS. 9 to 16; the measuring circuit 26 may for example be a measuring circuit as shown in FIG. 11 or 12.

The operation of the AMLCD 16 is as follows:

The display pixel matrix 17 operates to display images in the normal way, being driven by the gate and source drive circuitry 18,19 under the control of the display controller 20. The light source for the display is the backlight 21, which is typically an array of white LEDs which are driven and controlled by the backlight controller 22.

The ALS system 23 detects the ambient light level incident upon the photodiodes 25 and provides, at periodic intervals of time, a digitised output to the ALS controller 24.

The ALS controller 24 communicates with the backlight controller 22, which in turn modulates the intensity of the backlight 21 according to the output from the ALS system 23. Consequently this arrangement is capable of adjusting the brightness of the image displayed according to the ambient lighting intensity.

The advantages of this embodiment are that controlling the image brightness according to the ambient lighting conditions facilitates both an improved user experience and also a lower overall system power consumption, since under many ambient lightning conditions the backlight intensity can be reduced or the backlight turned off completely.

A further important advantage is that the Ambient Light Sensor circuitry (comprising the photodiodes 25, the measurement circuitry 26 and the ADC 27) can all be monolithically integrated onto the display TFT substrate 28. This has considerable benefits for the size, cost and ease of manufacture of the AMLCD product.

The magnitude of photocurrent produced by a thin film silicon photodiode increases as the width of the photodiode is increased. The width of the photodiodes, in an embodiment in which thin film silicon photodiodes are used, is therefore a compromise between the desire for a large photocurrent and the desire to minimise the size of the ALS system.

In principle, the ALS 23 may not be integrated on the display substrate 28 but may be provided on a separate substrate.

The embodiments of the invention have been described with reference to thin-film silicon photodiodes. However from the physics of series-connected photo-sensitive elements it is expected that the principle of using series-connecting photo-sensitive elements in an array and biasing the array with a bias voltage of, or close to zero volts, to facilitate improved signal to noise ratio is applicable to other photo-sensitive element systems. The invention is likely to be applicable to any system where the sensitivity is limited by the ratio of the photo-generated signal to the dark signal and where a peak in the signal-to-noise ratio is obtained around the value of the bias voltage of the photosensor element at which the photocurrent changes sign.

Moreover, it is expected that the invention may be applied using thin film photo-sensitive elements fabricated in other semiconductor systems than silicon.

The invention claimed is:

1. A method of operating a photosensor comprising: applying a bias voltage to a photosensor comprising n photo-sensitive elements connected in series, where n is an integer greater than one; determining the current in the photosensor at a time when the applied bias voltage across the photosensor maintains the photosensor at or close to the point at which it has the greatest signal-to-noise ratio; and maintaining a constant bias voltage across the photosensor irrespective of the light level on the photosensor.

2. A method as claimed in claim 1 and comprising determining the current in the photosensor at a time when the applied bias voltage across the photosensor is equal or approximately equal to n×V$_{bi}$, where V$_{bi}$ is the bias voltage about which the current in a single one of the photo-sensitive elements, in the dark, changes sign.

3. A method as claimed in claim 2 wherein the step of applying the bias voltage comprises applying a constant bias voltage equal or approximately equal to n×V$_{bi}$.

4. A method as claimed in claim 2 and comprising determining the current in the photosensor at a time when the applied bias voltage across the photosensor is equal or approximately equal to zero.

5. A method as claimed in claim 4 wherein the step of applying the bias voltage comprises applying a constant bias voltage equal or approximately equal to zero.

6. A method as claimed in claim 1, wherein $n \geq 10$.

7. A method as claimed in claim 1, wherein $n \geq 20$.

8. A method as claimed in claim 1, wherein $n \geq 50$.

9. A method as claimed in claim 1, wherein $n \geq 100$.

10. A method as claimed in claim 1 wherein each photo-sensitive element is a photodiode.

11. A method as claimed in claim 10 wherein each photo-sensitive element is a lateral photodiode.

12. A method as claimed in claim 1 wherein each photo-sensitive element is a phototransistor.

13. A method as claimed in claim 1 wherein each photo-sensitive element is a thin film photo-sensitive element.

14. A method as claimed in claim 13 wherein each photo-sensitive element is a silicon thin film photo-sensitive element.

15. A method as claimed in claim 1 wherein the photo-sensitive elements are nominally identical to one another.

16. A method as claimed in claim 1 and comprising connecting the n photo-sensitive elements in series between a first input of an operational amplifier and the second input of the operational amplifier.

17. A method as claimed in claim 1 and comprising connecting the n photo-sensitive elements in series between a first input of an operational amplifier and an output of the operational amplifier.

18. A method of operating a display device comprising the steps of: sensing an ambient light intensity according to a method as defined in claim 1; and controlling the intensity of a backlight of the display device in accordance with an output from the photosensor.

19. A light-sensing system comprising: a photosensor comprising n photo-sensitive elements connected in series, where n is an integer greater than one; bias means for applying a bias voltage to the photosensor; and determining means for determining the current in the photosensor at a time when the applied bias voltage across the photosensor maintains the photosensor at or close to the point at which it has the greatest signal-to-noise ratio, wherein the bias means are adapted to maintain a constant bias voltage across the photosensor irrespective of the light level on the photosensor.

20. A system as claimed in claim 19 wherein the determining means are adapted to determine the current in the photosensor at a time when the bias means applies a bias voltage across the photosensor that is equal or approximately equal to $n \times V_{bi}$, where $V_{bi}$ is the bias voltage about which the current in a single one of the photo-sensitive elements, in the dark, changes sign.

21. A system as claimed in claim 19 wherein the bias means applies, in use, a constant bias voltage equal or approximately equal to $n \times V_{bi}$.

22. A system as claimed in claim 19, wherein the determining means are adapted to determine the current in the photosensor at a time when the bias means applies a bias voltage across the photosensor that is equal or approximately equal to zero.

23. A system as claimed in claim 22, and further comprising a second photosensor connected in parallel to the first photosensor, the second photosensor comprising n photo-sensitive elements connected in series, wherein the second photosensor is connected in an opposite sense to the first photosensor.

24. A system as claimed in claim 23 wherein at least one cross-connection is provided between an inter-element node of the first photosensor and a corresponding inter-element node of the second photosensor.

25. A system as claimed in claim 19 wherein the bias means are adapted to apply a constant bias voltage equal or approximately equal to zero.

26. A system as claimed in claim 19 wherein $n \geq 10$.

27. A system as claimed in claim 19 wherein $n \geq 20$.

28. A system as claimed in claim 19 wherein $n \geq 50$.

29. A system as claimed in claim 19 wherein $n \geq 100$.

30. A system as claimed in claim 19 wherein each photo-sensitive element is a photodiode.

31. A system as claimed in claim 30 wherein each photo-sensitive element is a lateral photodiode.

32. A system as claimed in claim 19 wherein each photo-sensitive element is a phototransistor.

33. A system as claimed in claim 19 wherein each photo-sensitive element is a thin film photo-sensitive element.

34. A system as claimed in claim 33 wherein each photo-sensitive element is a silicon thin film photo-sensitive element.

35. A system as claimed in claim 19 wherein the photo-sensitive elements are nominally identical to one another.

36. A system as claimed in claim 19 wherein the n photo-sensitive elements are connected in series between a first input of an operational amplifier and the second input of the operational amplifier.

37. A system as claimed in claim 19 wherein the n photo-sensitive elements are connected in series between a first input of an operational amplifier and an output of the operational amplifier.

38. A system as claimed in claim 19 wherein the bias means and the determining means are comprised in a single circuit.

39. A display system comprising: a display device having a backlight; a light-sensing system as defined in claim 19 for sensing an ambient light intensity; and a controller for controlling the intensity of the backlight of the display device in accordance with an output from the light-sensing system.

* * * * *